US012641850B2

(12) United States Patent
Huang et al.

(10) Patent No.: US 12,641,850 B2
(45) Date of Patent: May 26, 2026

(54) LATTICE STACK FOR INTERNAL SPACER FABRICATION

(71) Applicant: Intel Corporation, Santa Clara, CA (US)

(72) Inventors: Cheng-Ying Huang, Hillsboro, OR (US); Urusa Alaan, Hillsboro, OR (US); Susmita Ghose, Hillsboro, OR (US); Rambert Nahm, Beaverton, OR (US); Natalie Briggs, Hillsboro, OR (US); Nicole K. Thomas, Portland, OR (US); Willy Rachmady, Beaverton, OR (US); Marko Radosavljevic, Portland, OR (US); Jack T. Kavalieros, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 453 days.

(21) Appl. No.: 17/517,925

(22) Filed: Nov. 3, 2021

(65) Prior Publication Data

US 2023/0134379 A1 May 4, 2023

(51) Int. Cl.
*H10D 64/01* (2025.01)
*H10D 30/67* (2025.01)
(Continued)

(52) U.S. Cl.
CPC ....... *H10D 64/018* (2025.01); *H10D 30/6713* (2025.01); *H10D 30/6735* (2025.01);
(Continued)

(58) Field of Classification Search
CPC ............. H10D 64/018; H10D 30/6713; H10D 30/6735; H10D 62/121; H10D 84/0158;
(Continued)

(56) References Cited

U.S. PATENT DOCUMENTS 10,192,867 B1 * 1/2019 Frougier .............. H10D 30/014
10,256,158 B1 * 4/2019 Frougier .............. H10D 84/017
(Continued)

FOREIGN PATENT DOCUMENTS

DE 102018218518 A1 5/2019

OTHER PUBLICATIONS

Extended European Search Report received for EP Application No. 22199064.1, dated Mar. 15, 2023. 10 pages.

*Primary Examiner* — Duy T Nguyen
(74) *Attorney, Agent, or Firm* — Acane Law PLLC

(57) ABSTRACT

Techniques are provided herein to form gate-all-around (GAA) semiconductor devices, such as those having a stacked transistor configuration. In one example case, two different semiconductor devices may both be GAA transistors each having any number of nanoribbons extending in the same (e.g., horizontal) direction where one device is located vertically above the other device. An internal spacer structure extends between the nanoribbons of both devices along the vertical direction, where the spacer structure includes one or more rib features between the two devices. A gate structure that includes one or more gate dielectric layers and one or more gate electrode layers may be formed around the nanoribbons of both devices, in some cases. In other cases, a split-gate configuration is used where upper and lower gate structures are separated by an isolation structure. Forksheet transistors and other GAA configurations may be formed using the techniques as well.

20 Claims, 16 Drawing Sheets

(51) Int. Cl.
  *H10D 62/10*        (2025.01)
  *H10D 84/01*        (2026.01)
  *H10D 84/03*        (2025.01)

(52) U.S. Cl.
  CPC ....... *H10D 62/121* (2025.01); *H10D 84/0158* (2025.01); *H10D 84/038* (2025.01)

(58) Field of Classification Search
  CPC ............. H10D 84/038; H10D 30/6757; H10D 30/014; H10D 30/43; H10D 64/017; H10D 88/00; H10D 84/0184; H10D 84/85; H10D 88/01; B82Y 10/00
  USPC ........................................................ 257/288
  See application file for complete search history.

(56)                References Cited

U.S. PATENT DOCUMENTS

| | | | |
|---|---|---|---|
| 2019/0172828 A1* | 6/2019 | Smith .................... | H10D 88/00 |
| 2020/0098756 A1 | 3/2020 | Lilak et al. | |
| 2020/0098920 A1 | 3/2020 | Chafik et al. | |
| 2020/0279913 A1 | 9/2020 | Ebrish et al. | |
| 2020/0287046 A1 | 9/2020 | Frougier et al. | |
| 2020/0403034 A1 | 12/2020 | Ando et al. | |
| 2020/0411641 A1* | 12/2020 | Noh ................... | H10D 30/6735 |
| 2021/0151608 A1* | 5/2021 | Lee ........................ | B82Y 10/00 |
| 2021/0234018 A1* | 7/2021 | Xie ...................... | H10D 64/018 |
| 2021/0296315 A1* | 9/2021 | Lilak ..................... | H10D 88/01 |

\* cited by examiner

400

LATTICE STACK FOR INTERNAL SPACER FABRICATION

FIELD OF THE DISCLOSURE

The present disclosure relates to integrated circuits, and more particularly, to the internal spacer fabrication process for gate-all-around (GAA) semiconductor devices.

BACKGROUND

As integrated circuits continue to scale downward in size, a number of challenges arise. For instance, reducing the size of memory and logic cells or otherwise increasing device density is becoming increasingly more difficult. One possible solution to increase device density is to stack transistor devices in a vertical direction. Some such transistor devices utilize nanoribbons with internal spacer structures to reduce parasitic capacitance and prevent electrical shorting between the gate and source or drain regions. There are many non-trivial challenges involved with the fabrication of such internal spacer structures.

Figure 1A:
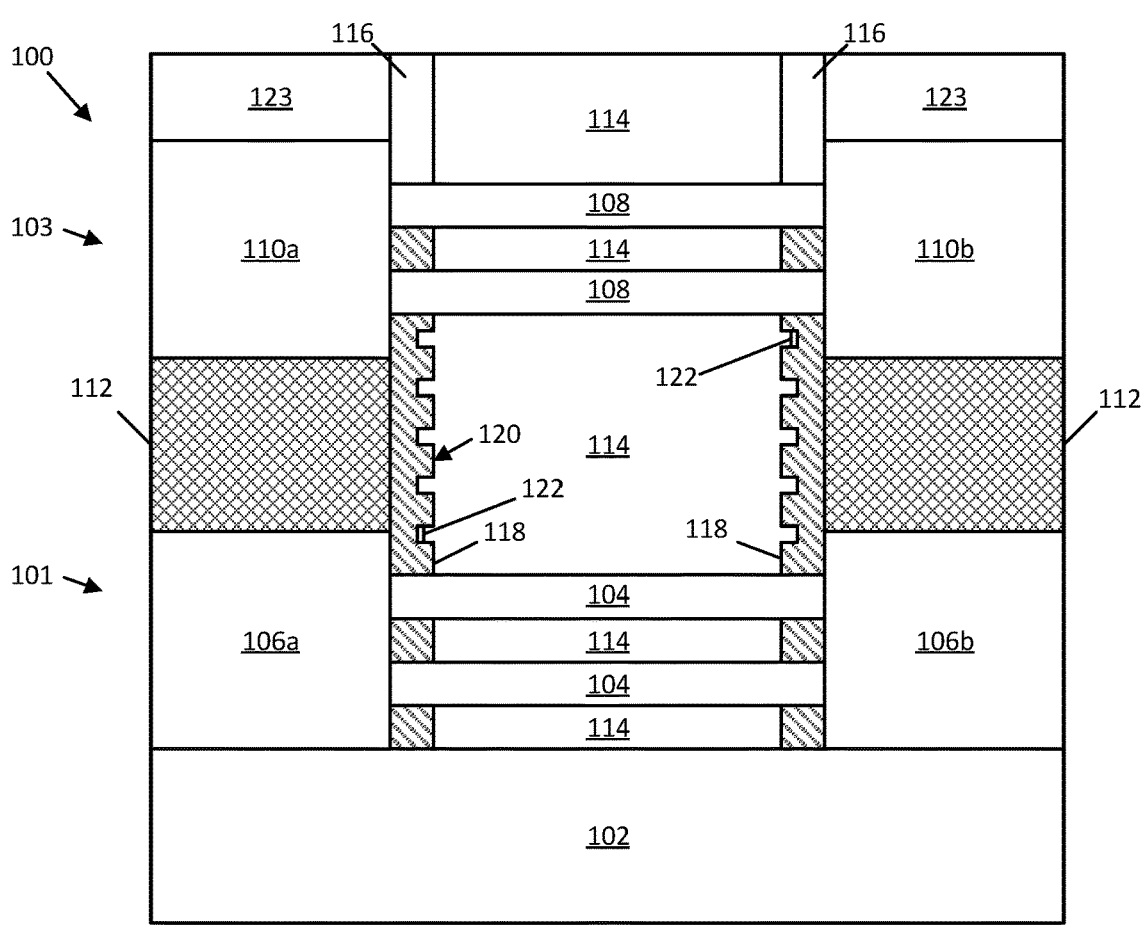
FIG. 1A is a cross-sectional view of an example integrated circuit having a semiconductor device with a particular spacer structure geometry, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form gate-all-around (GAA) semiconductor devices having an internal spacer between the gate structure and the source and drain regions. The techniques can be used in any number of transistor technologies, and are particularly useful in a stacked transistor configuration (e.g., stacked in a vertical z-direction from the substrate surface) or forksheet transistor configurations. In one example, two different semiconductor devices of a given memory or logic cell such as a synchronous random access memory (SRAM) cell, or a complementary metal oxide semiconductor (CMOS) cell, include a p-channel device and an n-channel device. More specifically, the n-channel device and the p-channel device may both be GAA transistors each having any number of nanoribbons extending in the same direction where the n-channel device is located vertically above the p-channel device (or vice versa). An internal spacer structure extends between the nanoribbons of the n-channel device and the nanoribbons of the p-channel device along the vertical direction, where the spacer structure includes one or more rib features between the n-channel device and the p-channel device. These rib features provide an inward-facing (toward channel region) sidewall of the spacer structure that has a crenelated-like or corrugated-like profile, which results from a fabrication process that involves a lattice structure with relatively thin sacrificial layers of channel material, which are in addition to sacrificial layers of non-channel material. The lattice structure helps facilitate a more uniform lateral etching process when forming recesses for the internal spacer, as well as a more uniform lateral etching process when removing excess spacer material. In some examples, portions of the sacrificial layers of channel material may remain between any of the rib features of the spacer structure. In some examples, a single monolithic gate structure that includes one or more gate dielectric layers and one or more gate electrode layers may be around the nanoribbons of both the n-channel device and the p-channel device. In another example, a split-gate configuration is used, which includes a first gate structure around the nanoribbons of the n-channel device and a second gate structure around the nanoribbons of the p-channel device, along with an isolation structure between and separating the first and second gate structures. In any such cases, the lower gate portion or gate structure may include a first workfunction metal, and the upper gate portion or gate structure may include a first workfunction metal. Numerous variations and embodiments will be apparent in light of this disclosure.

General Overview

As previously noted above, there remain a number of non-trivial challenges with respect to designing gate-all-around (GAA) semiconductor devices. In the case of stacked nanoribbon transistors, for example, some additional vertical distance may be provided between the lower and upper devices to provide sufficient isolation. However, this additional distance causes there to be uneven spacing between the uppermost nanoribbon of the lower transistor device and the lowermost nanoribbon of the upper transistor device, relative to the spacing between the upper or lower nanoribbons. The uneven spacing causes fabrication challenges when forming internal spacer structures that can lead to parasitic capacitance and shorting between the gate electrode and source or drain regions of a given semiconductor device.

Thus, and in accordance with an embodiment of the present disclosure, techniques are provided herein to form gate-all-around (GAA) transistors with a more robust internal spacer that provides sufficient isolation between, for example, stacked transistors and forksheet transistors. According to some embodiments, a lattice including additional relatively thin sacrificial layers of channel material (e.g., silicon layers) alternating with layers of non-channel material (e.g., silicon germanium layers) is provided between stacked nanoribbon devices to provide equal spacing between the various layers during the lateral etching process of the sacrificial layers between the nanoribbons. These additional sacrificial layers are thinner than the nanoribbons of each of the semiconductor devices. As such, these additional sacrificial material layers of channel material may be removed along with the non-channel sacrificial material, during the release of the nanoribbons. In some cases, portions of the additional sacrificial layers may remain within the gate area between stacked devices. According to some embodiments, the use of the material layer lattice having different layer thicknesses (e.g., relatively thin layers of sacrificial channel material and relatively thick layers of channel material) causes the spacer structure to have a ribbed pattern (e.g., crenelated or corrugated pattern along the inward-facing side of the spacer structures) between the stacked semiconductor devices. Although description herein focuses on the use of GAA transistor configurations, the techniques can be applied to other channel configurations as well, such as forksheet or nanosheet transistors.

According to an embodiment, an integrated circuit includes a semiconductor device having a first semiconductor nanoribbon extending in a first direction between a first source region and a first drain region and a second semiconductor nanoribbon extending in the first direction between a second source region and a second drain region. The first semiconductor nanoribbon may be one nanoribbon of a plurality of semiconductor nanoribbons extending between the first source region and the first drain region, and the second semiconductor nanoribbon may be one nanoribbon of a plurality of semiconductor nanoribbons extending between the second source region and the second drain region. The first semiconductor nanoribbon is spaced vertically from the second semiconductor nanoribbon in a second direction orthogonal to the first direction. The integrated circuit also includes a spacer structure that extends between the first semiconductor nanoribbon and the second semiconductor nanoribbon in the second direction and a gate structure around one or both the first semiconductor nanoribbon and the second semiconductor nanoribbon. The spacer structure includes one or more rib features between the first semiconductor nanoribbon and the second semiconductor nanoribbon. Note the gate structures may be gate-all-around structures or tri-gate structures or double-gate structures, depending on the channel configuration.

According to another embodiment, a method of forming an integrated circuit includes forming a first section of a multilayer fin, the first section including first material layers alternating with second material layers, the second material layers comprising a semiconductor material suitable for use as a nanoribbon channel; forming a second section of the multilayer fin over the first section, the second section having third material layers alternating with fourth material layers, wherein the third material layers are compositionally the same as the first material layers, and wherein the fourth material layers are thinner than the second material layers; forming a third section of the multilayer fin over the second section, the third section including fifth material layers alternating with sixth material layers, wherein the fifth material layers are compositionally the same as the first and third material layers, and the sixth material layers comprise a semiconductor material suitable for use as a nanoribbon channel; laterally etching portions of the first, third, and fifth material layers; and forming an inner spacer structure around exposed ends of the second, fourth, and sixth material layers.

The techniques are especially suited for use with gate-all-around transistors such as nanowire and nanoribbon transistors, but may also be applicable in some instances to finFET devices (e.g., stacked finFET structures). The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate electrode can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate a ribbed surface topology on the internal spacer structures between stacked devices and/or between a device and the substrate. In some embodiments, such tools may further indicate portions of the sacrificial material layers used to form the lattice between the devices. Such portions of the sacrificial material layers may include semiconductor materials or oxide materials within one or more recesses between adjacent ribs of the internal spacer structure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1A is a cross sectional view of a portion of an integrated circuit 100 that includes a first semiconductor device 101 and a second semiconductor device 103 stacked vertically over first semiconductor device 101, according to an embodiment of the present disclosure. The cross section view is taken lengthwise (perpendicular to gate structure) across first semiconductor device 101 and second semiconductor device 103 in a first direction while the devices are vertically stacked over one another in a second direction orthogonal to the first direction. Each of semiconductor devices 101 and 103 may be gate-all-around (GAA) transistors, although other transistor topologies and types could also benefit from the techniques provided herein. The illustrated embodiments herein use the GAA structure. Semiconductor devices 101 and 103 represent a portion of integrated circuit 100 that may contain any number of similar semiconductor devices.

As can be seen, semiconductor devices 101 and 103 are formed over a substrate 102. Any number of semiconductor devices can be formed in a stacked configuration over substrate 102, but two are used here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

First semiconductor device 101 may include any number of semiconductor nanoribbons 104 extending between a source region 106a and a drain region 106b. Likewise, second semiconductor device may include any number of semiconductor nanoribbons 108 extending between a source region 110a and a drain region 110b. Any source region may also act as a drain region and vice versa, depending on the application. In some embodiments, semiconductor devices 101 and 103 have an equal number of nanoribbons, while in other embodiments they have an unequal number of nanoribbons. In some embodiments, each of nanoribbons 104 and nanoribbons 108 are formed from a fin of alternating material layers (e.g., alternating layers of silicon and silicon germanium) where sacrificial material layers are removed between nanoribbons 104 and nanoribbons 108. Each of nanoribbons 104 and nanoribbons 108 may include the same semiconductor material as substrate 102, or not. In still other cases, substrate 102 is removed. In some such cases, there may be, for example one or more backside interconnect and/or contact layers. In any such cases, and according to some embodiments, a vertical distance between about 20 nm and about 80 nm separates the nanoribbons 104 of first semiconductor device 101 from the nanoribbons 108 of second semiconductor device 103. Other embodiments may have a smaller or larger such vertical distance.

According to some embodiments, an insulating layer 112 is provided between stacked source regions 106a and 110a and between stacked drain regions 106b and 110b. Insulating layer 112 may be any suitable dielectric material, such as silicon dioxide, aluminum oxide, silicon nitride, or silicon oxycarbonitride. In still other embodiments, layer 112 may be or otherwise include an air gap or void. According to some embodiments, each of source regions 106/110a and drain regions 106b/110b are epitaxial regions that are provided using an etch-and-replace process. In other embodiments one or both of the source regions 106a/110a and drain regions 106b/110b could be, for example, implantation-doped native portions of the semiconductor nanoribbons, fins or substrate. Any semiconductor materials suitable for source and drain regions can be used (e.g., group IV and group III-V semiconductor materials). The source regions 106a/110a and drain regions 106b/110b may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

Insulating layer 123 allows for a planarized structure, such that the top surface of gate structure 114 is co-planar with the top surface of insulating layers 123. Insulating layer 123 may be the same material as insulating layer 112, or any other suitable dielectric material. A gate structure 114 is provided over each of nanoribbons 104 and nanoribbons 108, according to some embodiments. Spacer structures 116 are included on either side of gate structure 114. Spacer structures 116 may include a dielectric material, such as silicon nitride, silicon oxynitride, or silicon oxycarbonitride. Gate structure 114 includes both a gate dielectric around each of nanoribbons 104 and nanoribbons 108 and a gate electrode over the gate dielectric. The gate dielectric may include a single material layer or multiple material layers. In some embodiments, the gate dielectric includes a first dielectric layer such as an oxide native to nanoribbons 104 and 108 (e.g., silicon oxide) and a second dielectric layer that includes a high-k material (e.g., such as hafnium oxide). The high-k dielectric material may be doped with an element to affect the threshold voltage of the given semiconductor device. In other embodiments, the gate dielectric only includes high-k dielectric material; in still other embodiments, the gate dielectric only includes regular-k dielectric material (e.g., silicon oxide). In some embodiments, the gate dielectric around nanoribbons 104 has a different element doping concentration compared to the gate dielectric around nanoribbons 108. According to some embodiments, the doping element used in the gate dielectric is lanthanum.

According to some embodiments, the gate electrode extends over the gate dielectric around each of nanoribbons 104 and nanoribbons 108 and also generally fills the remaining space between the various nanoribbons of any number of stacked semiconductor devices. The gate electrode may include any sufficiently conductive material such as a metal, metal alloy, or doped polysilicon. In some embodiments, the gate electrode includes one or more workfunction metals around nanoribbons 104 and 108. In some embodiments, semiconductor device 101 is a p-channel device that includes n-type dopants within nanoribbons 104 and includes a workfunction metal having titanium around nanoribbons 104 and semiconductor device 103 is an n-channel device that includes p-type dopants within nanoribbons 108 and includes a workfunction metal having tungsten around nanoribbons 108. N-type dopants may also be used within the nanoribbons of an n-channel device and p-type dopants may be used within the nanoribbons of a p-channel device in order to tune the transistor's threshold voltage. The gate electrode may also include a fill metal or other conductive material around the workfunction metals to provide the whole gate electrode structure. According to some embodiments, the gate structure may be interrupted between any adjacent semiconductor devices in the vertical horizontal by a gate cut structure.

As discussed above, semiconductor device 101 may be a p-channel device having semiconductor nanoribbons 104 doped with n-type dopants (e.g., phosphorous or arsenic) and semiconductor device 103 may be an n-channel device having semiconductor nanoribbons 108 doped with p-type dopants (e.g., boron). Each of semiconductor devices 101 and 103 are separated by a vertical distance that is larger than the distance between adjacent nanoribbons. According to some embodiments, internal spacers 118 extend vertically between semiconductor devices 101 and 103 and also between adjacent nanoribbons of each of semiconductor devices 101 and 103. Internal spacers 118 may include any suitable dielectric material, such as silicon dioxide, aluminum oxide, silicon nitride, silicon carbide, silicon oxycarbonitride, or low-K versions (e.g., porous or doped) of any of these that can provide electrical isolation between gate structure 114 and the source or drain regions. In some embodiments, internal spacers 118 have the same material composition as spacer structures 116. As can be seen, internal spacer 118 includes a plurality of rib features 120 that may take the form of any protruding shape. In particular, the inward-facing side (side facing the channel region) of each internal spacer 118 rises and falls to provide a crenelated or corrugated pattern along that inward-facing side. Rib features 120 may be periodically located along the vertical length of internal spacer 118 between semiconductor devices 101 and 103. In some embodiments, rib features 120 align across from one another in the horizontal direction on both sides of gate structure 114. Rib features 120 are left behind when forming internal spacer 118 as described in more detail herein with reference to the illustrated fabrication process of FIGS. 2A-2I". As can be further seen, a material remnant or plug 122 may be present within one or more recesses between adjacent rib features 120. Material plug 122 may include a semiconductor material (e.g., silicon) or it may be an oxidized semiconductor material (e.g., silicon oxide). Material plug 122 may be generally any size and may fill any portion of the recess. In some examples, material plug 122 extends outward from the recess and beyond the ends of rib features 120.

Figure 1B:
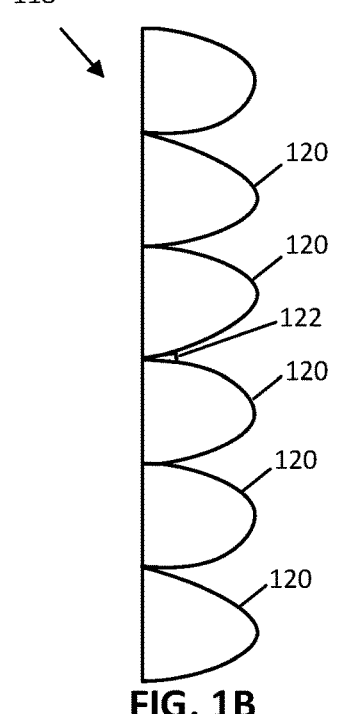
FIG. 1B is a cross-sectional view of an example spacer structure, in accordance with an embodiment of the present disclosure.

FIG. 1B illustrates an internal spacer 118 similar to that depicted in FIG. 1A, except that the various features are drawn to reflect real-world process conditions, according to an embodiment. For instance, while FIG. 1A generally indicates the various features using straight lines, right angles, and smooth surfaces, an actual integrated circuit structure configured in accordance with an embodiment of the present disclosure may have less than perfect straight lines and right angles, and some features may have a rough surface topography or otherwise be non-smooth, given real-world limitations of fabrication processes such as etching and depositing. As can be seen in FIG. 1B, the various rib features 120 of internal spacer 118 are more rounded and blob-like. Furthermore, such rib features may not have the exact same geometry. According to some embodiments, a material remnant or plug 122 may be present within one or more recesses between adjacent rib features 120. The previous relevant discussion from above is equally applicable here.

Figure 1C:
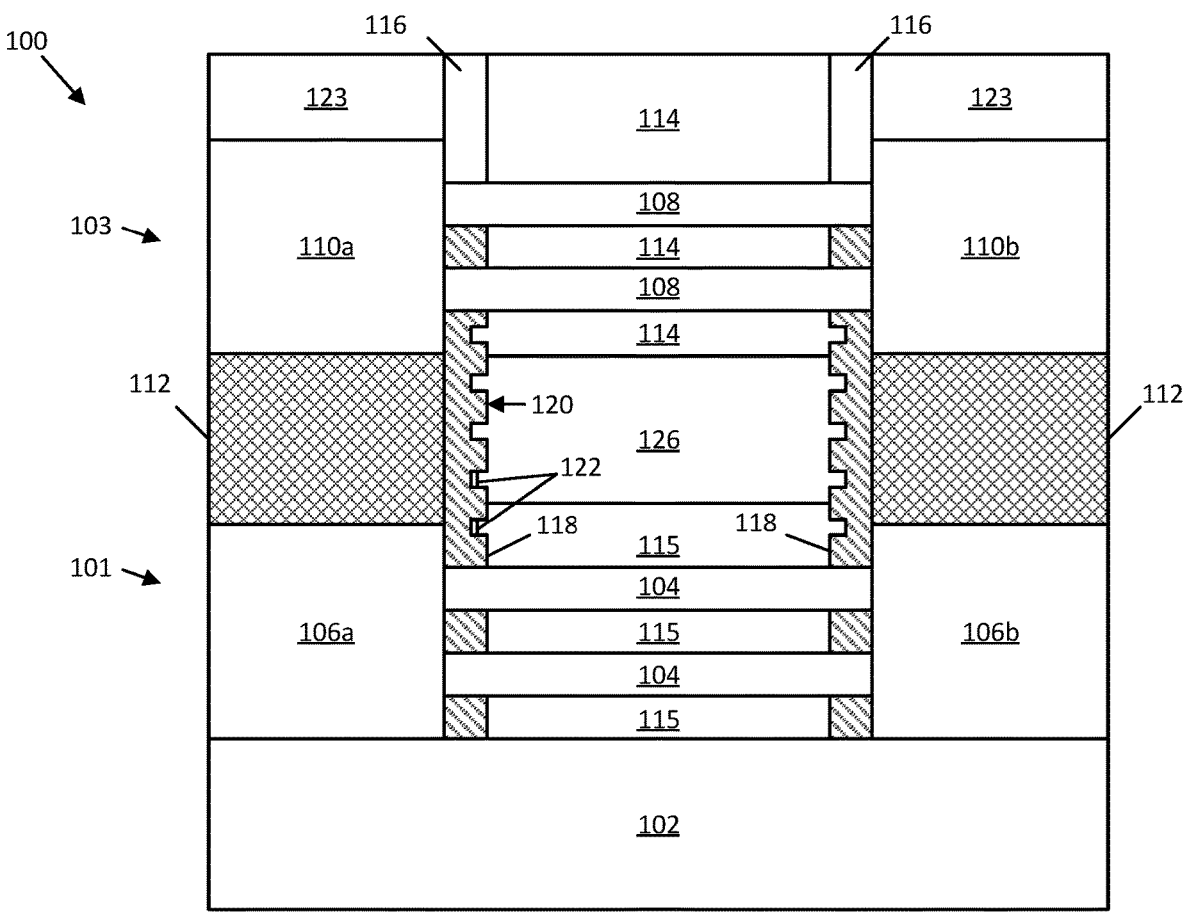
FIG. 1C is a cross-sectional view of another example integrated circuit having a semiconductor device with a particular spacer structure geometry, in accordance with an embodiment of the present disclosure.

FIG. 1C is a cross sectional view of a portion of an integrated circuit 100 that includes a first semiconductor device 101 and a second semiconductor device 103 stacked vertically over first semiconductor device 101, according to another embodiment of the present disclosure. As can be seen, this example is similar to that of FIG. 1A, except that this example includes a split-gate configuration, rather than a single monolithic gate structure for both the upper and lower devices. In particular, upper gate structure 114 is around nanowires 108, and lower gate structure 115 is around nanowires 104. An isolation structure 126 is between and separates the upper gate structure 114 and the lower gate structure 115. The previous relevant discussion for each of the depicted features is equally applicable here. Note that the upper gate structure 114 may be configured differently from the upper gate structure 115, or the same. In one example case, the upper gate structure 114 and the lower gate structure 115 include the same gate dielectric, but include different workfunction materials in their respective gate electrodes. For instance, one of the upper or lower gate electrode may include a p-type workfunction material (e.g., titanium nitride) and the other of the upper or lower gate electrode may include an n-type workfunction material (e.g., titanium aluminum carbide). The isolation structure 126 can be any suitable dielectric material, such as silicon oxide, and may be the same material, for instance, as insulating layers 112 and/or 123.

Further note in this embodiment that isolation structure 126 fills at least some of the recesses between adjacent rib features 120. In some such embodiments, the recesses between adjacent rib features 120 are void of any gate structure 114 materials (e.g., they are removed prior to deposition of isolation structure 126). In other embodiments, the gate dielectric of gate electrode 115 remains along the inward-facing sidewalls of the internal spacer structures 118, including the bottom of the recesses between adjacent rib features 120, such that the gate dielectric of gate electrode 115 is also between the internal spacer structure 118 and isolation structure 126, in addition to being between gate structure 115 and semiconductor nanoribbons 104. In other embodiments, isolation structure 126 may be thinner (in the y-axis direction), such that is does not extend along all the recesses between adjacent rib features 120. In such cases, one or more of those recesses not covered by isolation structure 126 may also include a portion of one or both gates structures 114 and 115, depending on the gate processing employed and symmetry (or asymmetry, as the case may be) of the upper and lower gate structures relative to the recesses. The previous relevant discussion with respect to one or more workfunction metals being in the recesses 120 is equally applicable here.

Fabrication Methodology

FIGS. 2A-2I" include cross-sectional views that collectively illustrate an example process for forming an integrated circuit configured with stacked semiconductor devices having a ribbed internal spacer structure, in accordance with some embodiments of the present disclosure. Each figure shows an example structure that results from the process flow up to that point in time, so the depicted structure evolves as the process flow continues, culminating in the structure shown in FIG. 2I (or 2I' or 2I"), which is similar to the structure illustrated in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
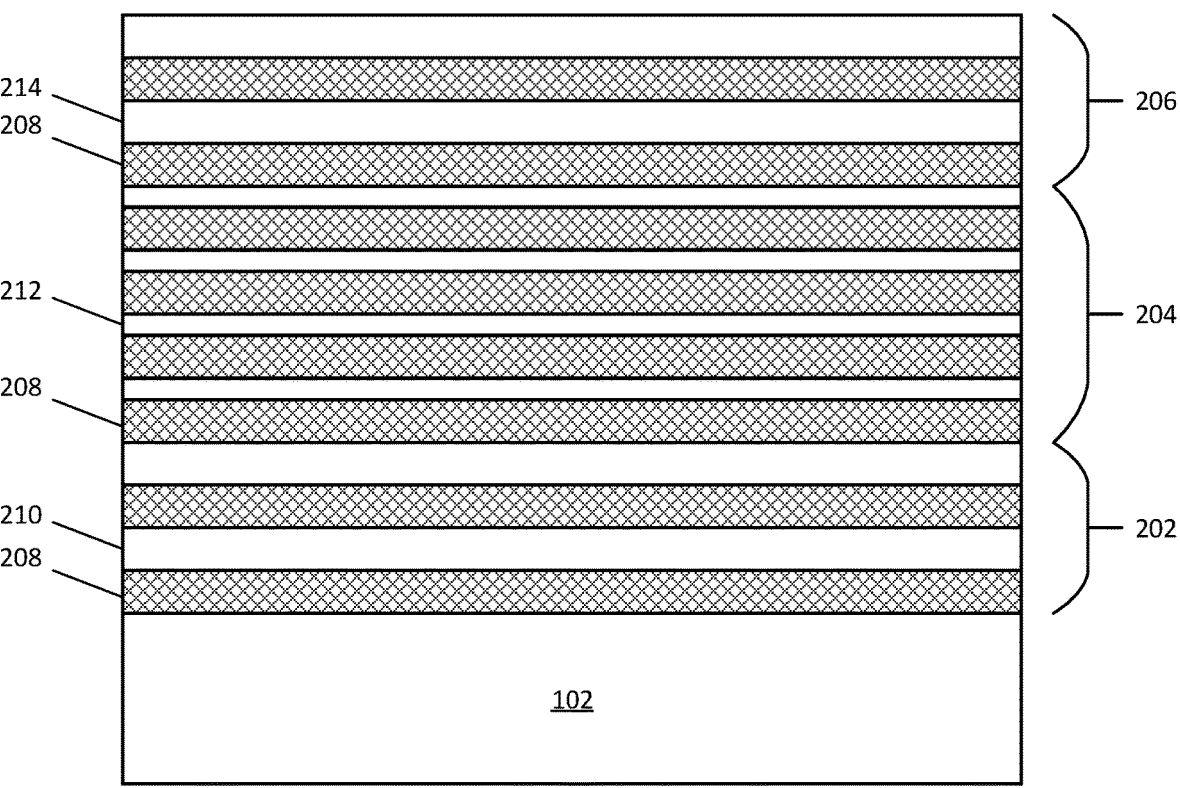
FIGS. 2A-2I" are cross-sectional views that collectively illustrate an example process for forming a semiconductor device using a lattice stack to affect the internal spacer formation, in accordance with some embodiments of the present disclosure.

FIG. 2a illustrates a cross-sectional view across a substrate having a series of material layers deposited over it, according to an embodiment of the present disclosure. The previous relevant discussion with respect to example configurations and materials for substrate 102 is equally applicable here. Alternating material layers may be deposited over substrate 102, including a first layer stack 202, a second layer stack 204, and a third layer stack 206. Each of the layer stacks includes sacrificial layers 208 alternating with other material layers, such as first semiconductor layers 210 of first layer stack 202, dummy layers 212 of second layer stack 204, and second semiconductor layers 214 of third layer stack 206. Any number of alternating sacrificial layers 208 and material layers may be deposited within each of first layer stack 202, second layer stack 204, and third layer stack 206. It should be noted that the cross section illustrated in FIG. 2a is taken along the length of a fin formed from the multiple alternating layers and extending up above the surface of substrate 102.

According to some embodiments, sacrificial layers 208 have a different material composition than each of first semiconductor layers 210, dummy layers 212, and second semiconductor layers 214. In some embodiments, sacrificial layers 208 are silicon germanium (SiGe) while each of first semiconductor layers 210 and second semiconductor layers 214 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 208 and first and second semiconductor layers 210 and 214, the germanium concentration is different between sacrificial layers 208 and first and second semiconductor layers 210 and 214. For example, sacrificial layers 208 may include a higher germanium content compared to first and second semiconductor layers 210 and 214. Dummy layers 212 may include the same material as either first semiconductor layers 210 or second semiconductor layers 214. In some examples, dummy layers 212 include any material that exhibits etch selectivity with the material of sacrificial layers 208 (e.g., SiGe).

While dimensions can vary from one example embodiment to the next, the thickness of each sacrificial layer 208 may be between about 5 nm and about 10 nm. In some embodiments, the thickness of each sacrificial layer 208 is substantially the same (e.g., within 1-2 nm) across each of first layer stack 202, second layer stack 204, and third layer stack 206. The thickness of each of first semiconductor layers 210 and second semiconductor layers 214 may be about the same as the thickness of each sacrificial layer 208 (e.g., about 5-20 nm). However, according to some embodiments, the thickness of each dummy layer 212 is thinner compared to either sacrificial layers 208 or first and second semiconductor layers 210 and 214. Dummy layers 212 make up a lattice of layer structures used to produce the spacing needed for multiple sacrificial layers 208 of substantially the same thickness along each of first layer stack 202, second layer stack 204, and third layer stack 206. While dimensions can vary from one example embodiment to the next, the thickness of each dummy layer 212 may be between about 1 nm to about 4 nm. The total thickness of second layer stack 204 generally defines the vertical space between the stacked semiconductor devices and may be between about 20 nm and about 60 nm. Each of sacrificial layers 208, first semiconductor layers 210, dummy layers 212, and second semiconductor layers 214 may be deposited using any known material deposition technique, such as chemical vapor deposition (CVD), plasma-enhanced chemical vapor deposition (PECVD), physical vapor deposition (PVD), or atomic layer deposition (ALD).

The periodicity of dummy layers 212 within second layer stack 204 may vary depending on the application and materials used. In some examples, the germanium content of the SiGe sacrificial layers 208 in second layer stack 204 is different than the germanium content of the SiGe sacrificial layers 208 in first layer stack 202 and third layer stack 206. The germanium content of the sacrificial layers 208 within second layer stack 204 can be adjusted along with different periodicities of dummy layers 212 to achieve a uniform etching profile across all sacrificial layers 208.

First semiconductor layers 210 may be doped with either n-type dopants (to produce a p-channel transistor) or p-type dopants (to produce an n-channel transistor). Similarly, second semiconductor layers 214 may be doped with either n-type dopants (to produce a p-channel transistor) or p-type dopants (to produce an n-channel transistor).

Figure 2B:
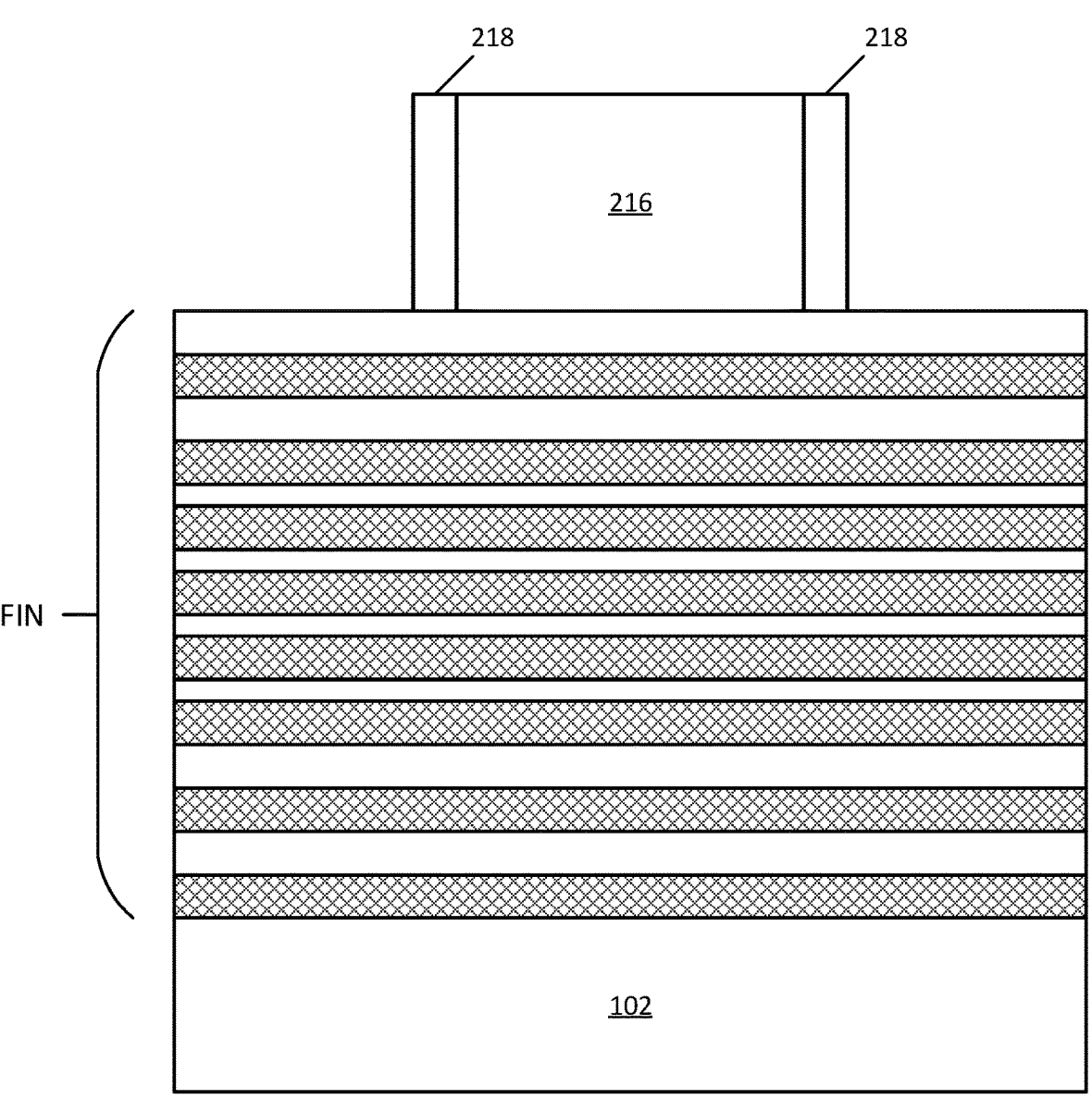

FIG. 2b illustrates a cross-sectional view of the structure shown in FIG. 2A following the formation of a sacrificial gate structure 216 and sidewall spacers 218 over the alternating layer structure of the fin, according to an embodiment. Sacrificial gate structure may run in an orthogonal direction to the length of the fin and may include any material that can be safely removed later in the process without etching or otherwise damaging any portions of the fin or of spacer structures 218. In some embodiments, sacrificial gate structure 216 includes polysilicon. Spacer structures 218 may be formed using an etch-back process where spacer material is deposited everywhere and then anisotropically etched to leave the material only on sidewalls of structures including sacrificial gate structure 216. Spacer structures 218 may include a dielectric material, such as silicon nitride, silicon oxy-nitride, or any formulation of those layers incorporating carbon or boron dopants. Sacrificial gate structure 216 together with spacer structures 218 define a portion of the fin that will be used to form a stack of transistor devices as discussed further herein.

Figure 2C:
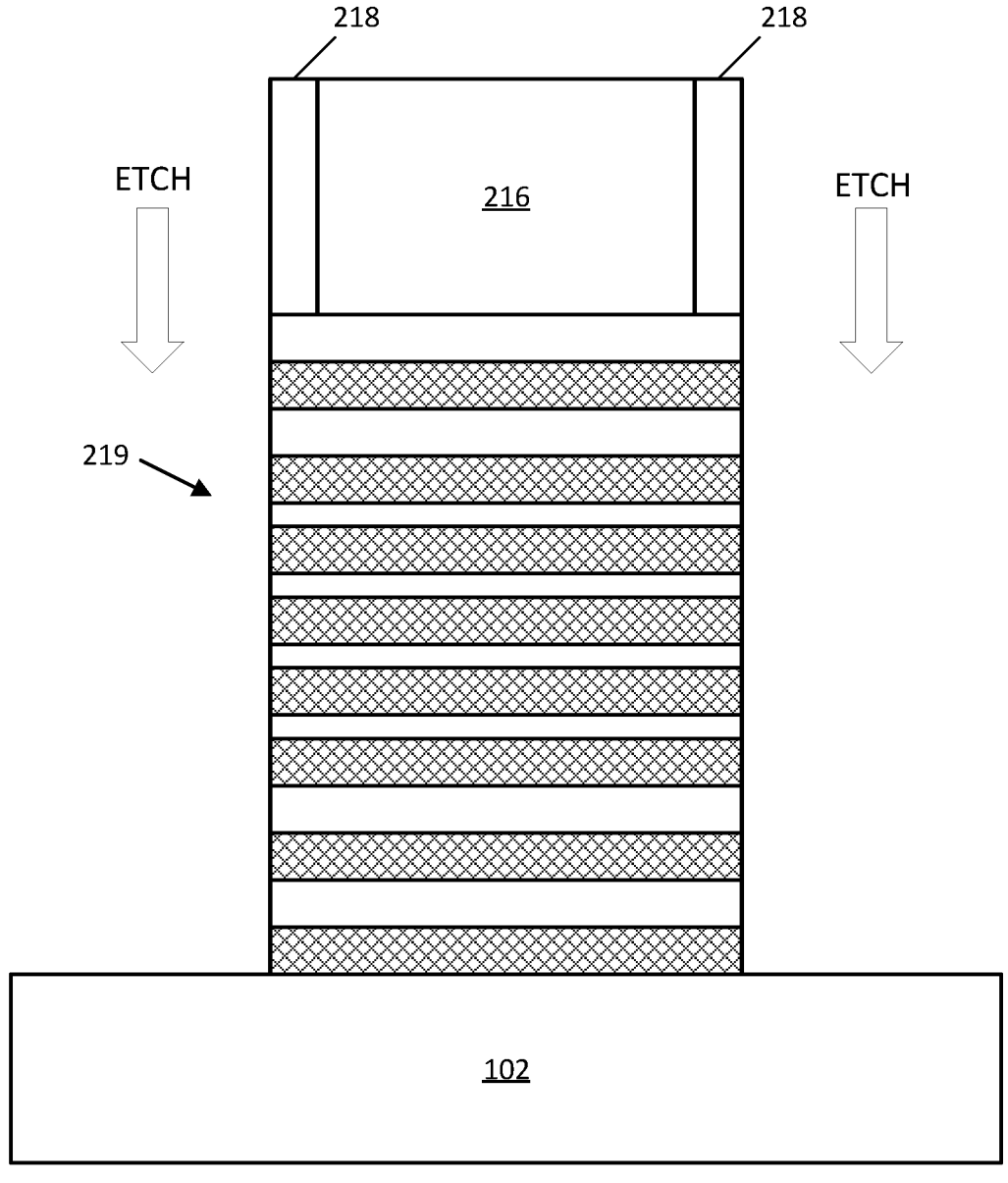

FIG. 2C illustrates a cross-sectional view of the structure shown in FIG. 2B following the removal of the exposed fin not under sacrificial gate structure 216 and sidewall spacers 218, according to an embodiment of the present disclosure. According to some embodiments, the various layers of the different layer stacks are etched at substantially the same rate using an anisotropic RIE process. As observed in FIG. 2C, the width of spacer structure 218 works to define the length of the resulting fin 219. In some embodiments, some under-cutting occurs along the edges of fin 219 beneath spacer structures 218 such that the length of fin 219 is not exactly the same as a sum of the widths of spacer structures 218 and a width of sacrificial gate structure 216. The RIE process may also etch into substrate 102 thus recessing portions of substrate 102 on either side of fin 219.

Figure 2D:
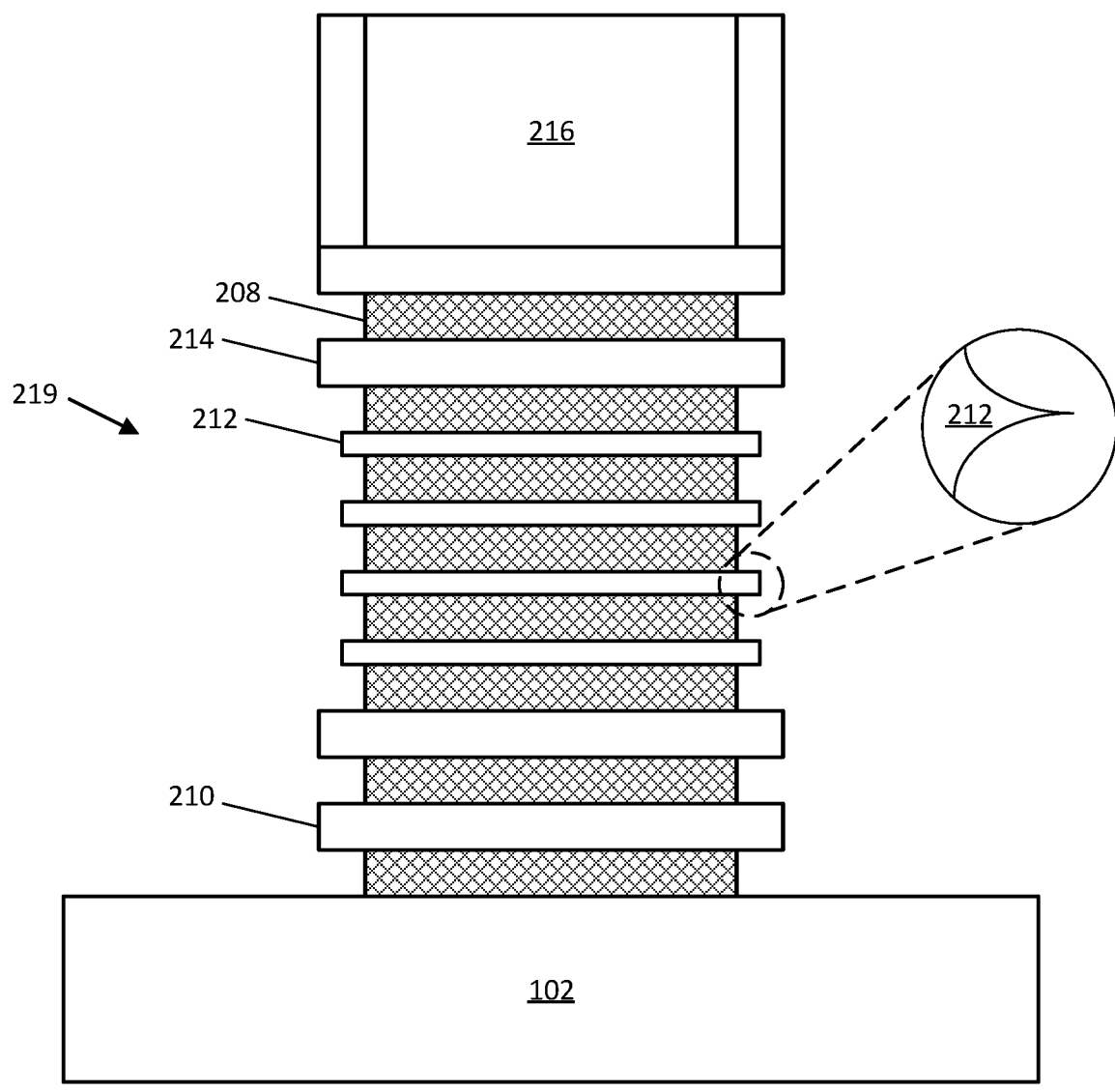

FIG. 2D illustrates a cross-sectional view of the structure shown in FIG. 2C following the removal of portions of sacrificial layers 208, according to an embodiment of the present disclosure. An isotropic etching process may be used to recess the exposed ends of each sacrificial layer 208 along the entire layer stack of fin 219. Due to the presence of dummy layers 212, each sacrificial layer 208 can have substantially the same thickness which yields a more uniform etching profile across each sacrificial layer 208. According to some embodiments, the etching process also causes the ends of dummy layers 212 to recess inwards more than either first semiconductor layers 210 or second semiconductor layers 214. In some embodiments, each end of dummy layers 212 may recess inwards by between 5 nm and 15 nm. This recessing may occur due to the relatively small thickness of dummy layers 212. As seen in the magnified view at one of the ends of dummy layers 212, the ends may include a pointed tip from the isotropic etching process.

Figure 2E:
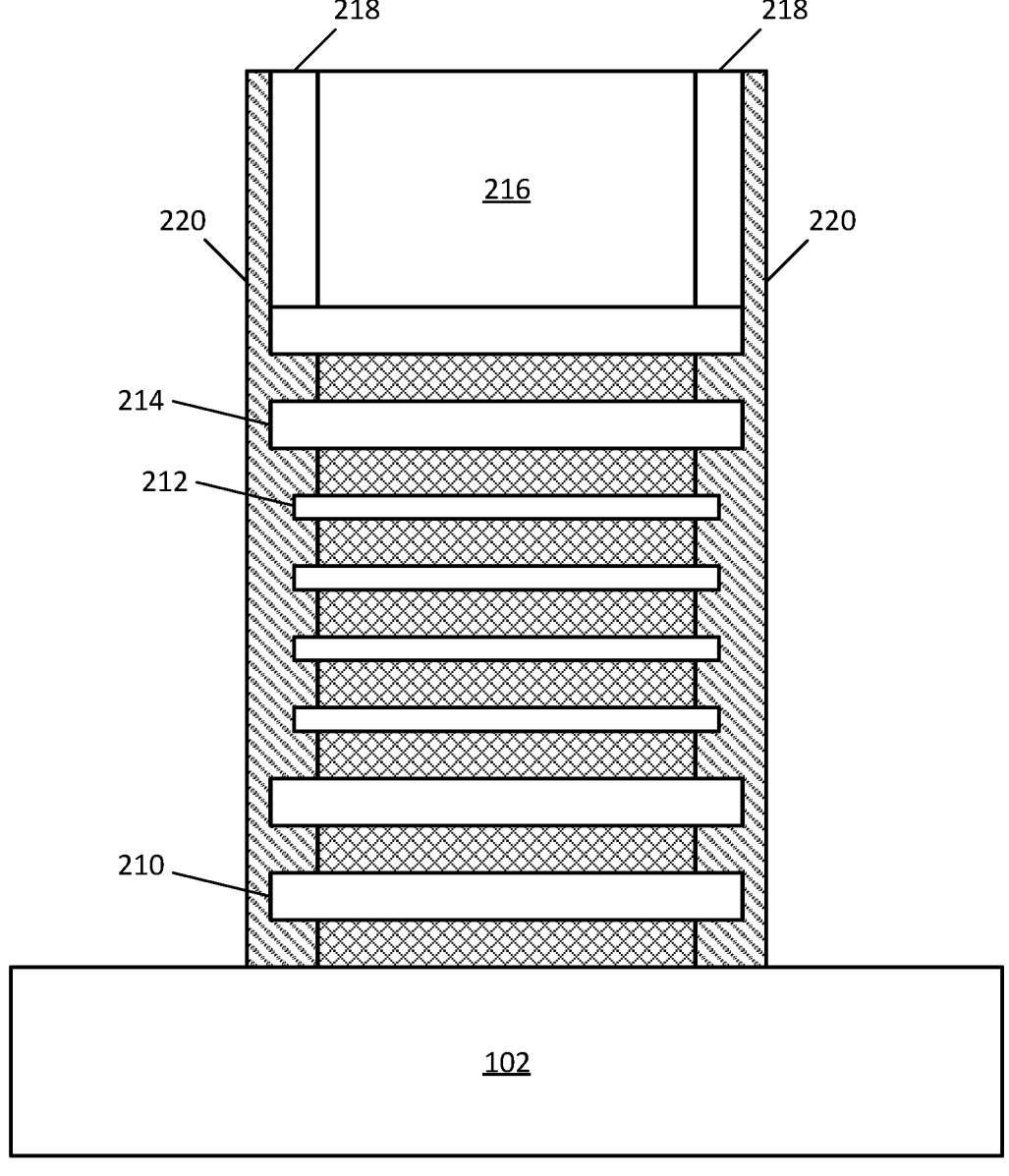

FIG. 2E illustrates a cross-sectional view of the structure shown in FIG. 2D following the formation of internal spacers 220, according to an embodiment of the present disclosure. Internal spacers 220 may have a material composition that is similar to or the exact same as spacer structures 218. Accordingly, internal spacers 220 may be any suitable dielectric material that exhibits high etch selectively to semiconductor materials such as silicon and/or silicon germanium. Internal spacers 220 may be conformally deposited over the sides of the fin structure using a CVD process like ALD.

According to some embodiments, internal spacers 220 conformally form around the ends of dummy layers 212 thus providing a more uniform sidewall topography after internal spacers 220 have been recessed back to expose the ends of first semiconductor layers 210 and second semiconductor layers 214. Without the presence of dummy layers 212, internal spacers 220 would conformally form along the long sidewall of the sacrificial material and could be removed (thus exposing sacrificial layers 208) during the subsequent etch-back process that exposes the ends of first semiconductor layers 210 and second semiconductor layers 214.

Figure 2F:
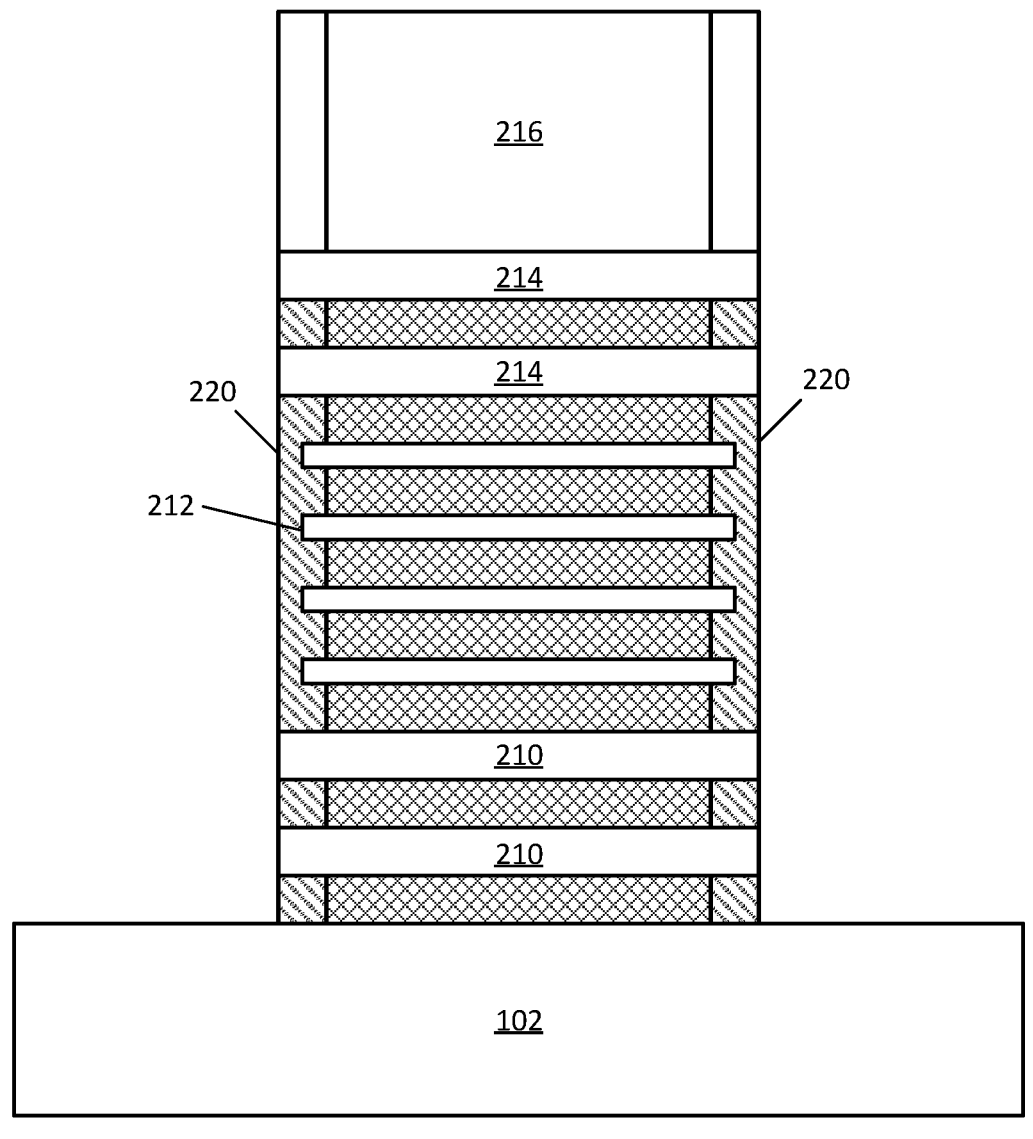

FIG. 2F illustrates a cross-sectional view of the structure shown in FIG. 2E following an etch-back process of internal spacers 220, according to an embodiment of the present disclosure. An isotropic etching process may be used to uniformly recess internal spacers 220. According to some embodiments, internal spacers 220 are recessed inwards at least until the ends of both first semiconductor layers 210 and second semiconductor layers 214 are exposed. According to some embodiments, the recessed internal spacers 220 still cover the ends of dummy structures 212. The presence of dummy structures 212 ensures that internal spacers 220 remain in the vertical region between first semiconductor layers 210 and second semiconductor layers 214 following the isotropic etching process.

Figure 2G:
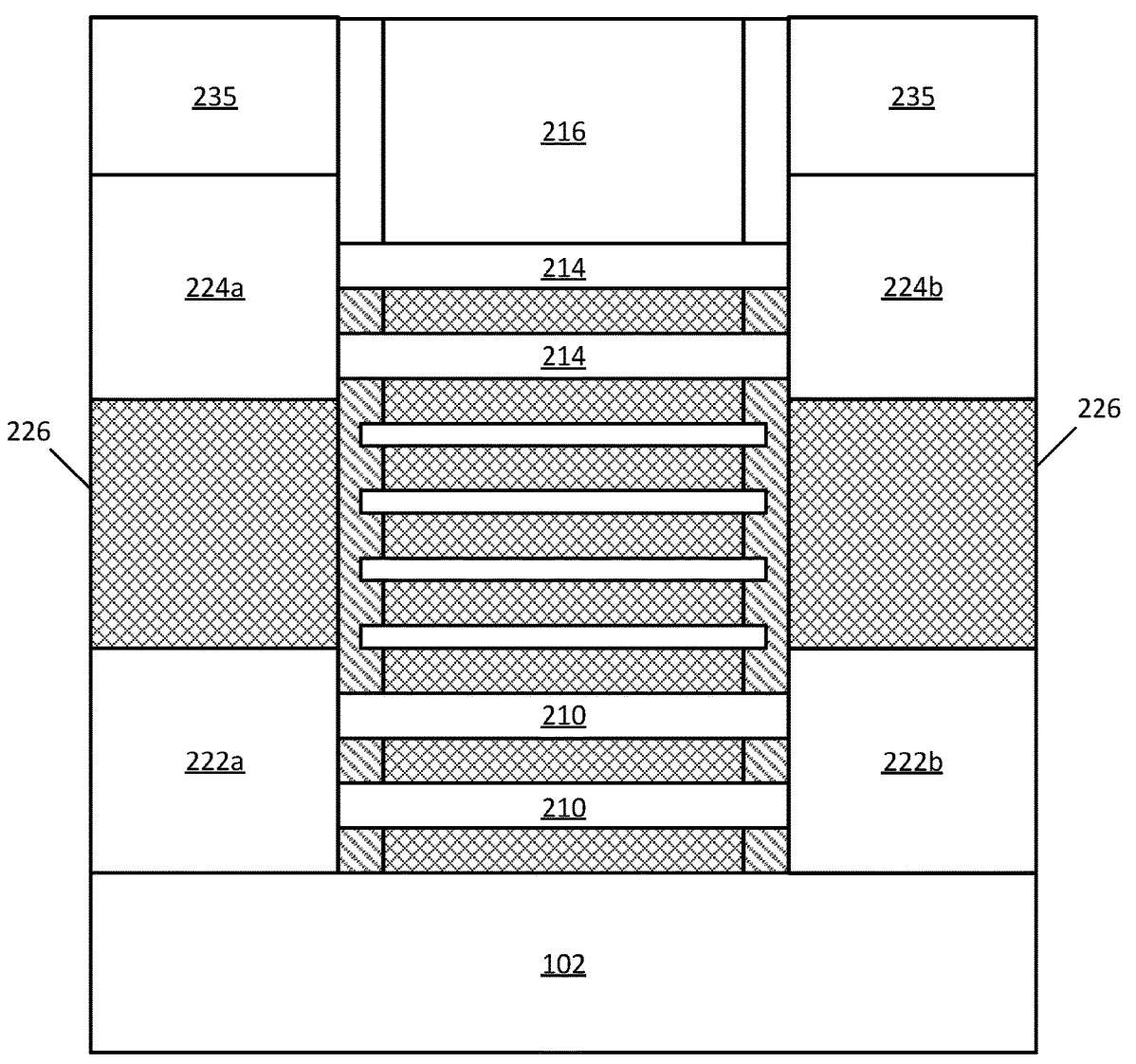

FIG. 2G illustrates a cross-sectional view of the structure shown in FIG. 2F following the formation of source and drain regions and deposition of an insulating layer 235 and planarization of the structure (e.g., via chemical mechanical planarization, CMP), according to an embodiment of the present disclosure. Due to the vertically stacked spacing between first semiconductor layers 210 and second semiconductor layers 214, a similarly stacked formation of source and drain regions is created. According to an embodiment, a first source region 222a and a first drain region 222b are formed at either ends of first semiconductor layers 210. In some examples, first source and drain regions 222a/222b are epitaxially grown over substrate 102. Any semiconductor materials suitable for first source and drain regions 222a/222b can be used (e.g., group IV and group III-V semiconductor materials). First source and drain regions 222a/222b may include multiple layers such as liners and capping layers to improve contact resistance. In any such cases, the composition and doping of first source and drain regions 222a/222b may be the same or different, depending on the polarity of the transistor. In one example, first semiconductor layers 210 are doped with n-type dopants and first source or drain regions 222a/222b include a high concentration of p-type dopants (PMOS transistor). Any number of source and drain configurations and materials can be used. Insulating layer 235 can be any suitable dielectric material, such as those discussed with reference to insulating layer 123.

According to an embodiment, a second source region 224a and a second drain region 224b are formed at either ends of second semiconductor layers 214. In some examples, second source or drain regions 224a/224b are epitaxially grown over an insulator layer 226. Any semiconductor materials suitable for second source and drain regions 224a/224b can be used (e.g., group IV and group III-V semiconductor materials). Second source and drain regions 224a/224b may include multiple layers such as liners and capping layers to improve contact resistance. In any such cases, the composition and doping of second source or drain regions 224a/224b may be the same or different, depending on the polarity of the transistor. In one example, second semiconductor layers 214 are doped with p-type dopants and second source and drain regions 224a/224b include a high concentration of n-type dopants (NMOS transistor). Any number of source and drain configurations and materials can be used.

According to some embodiments, insulator layer 226 is formed between vertically adjacent source regions 222a and 224a and vertically adjacent drain regions 222b and 224b. Insulator layer 226 may be any suitable dielectric material with a thickness sufficient to provide electrical isolation between the source and drain regions.

Figure 2H:
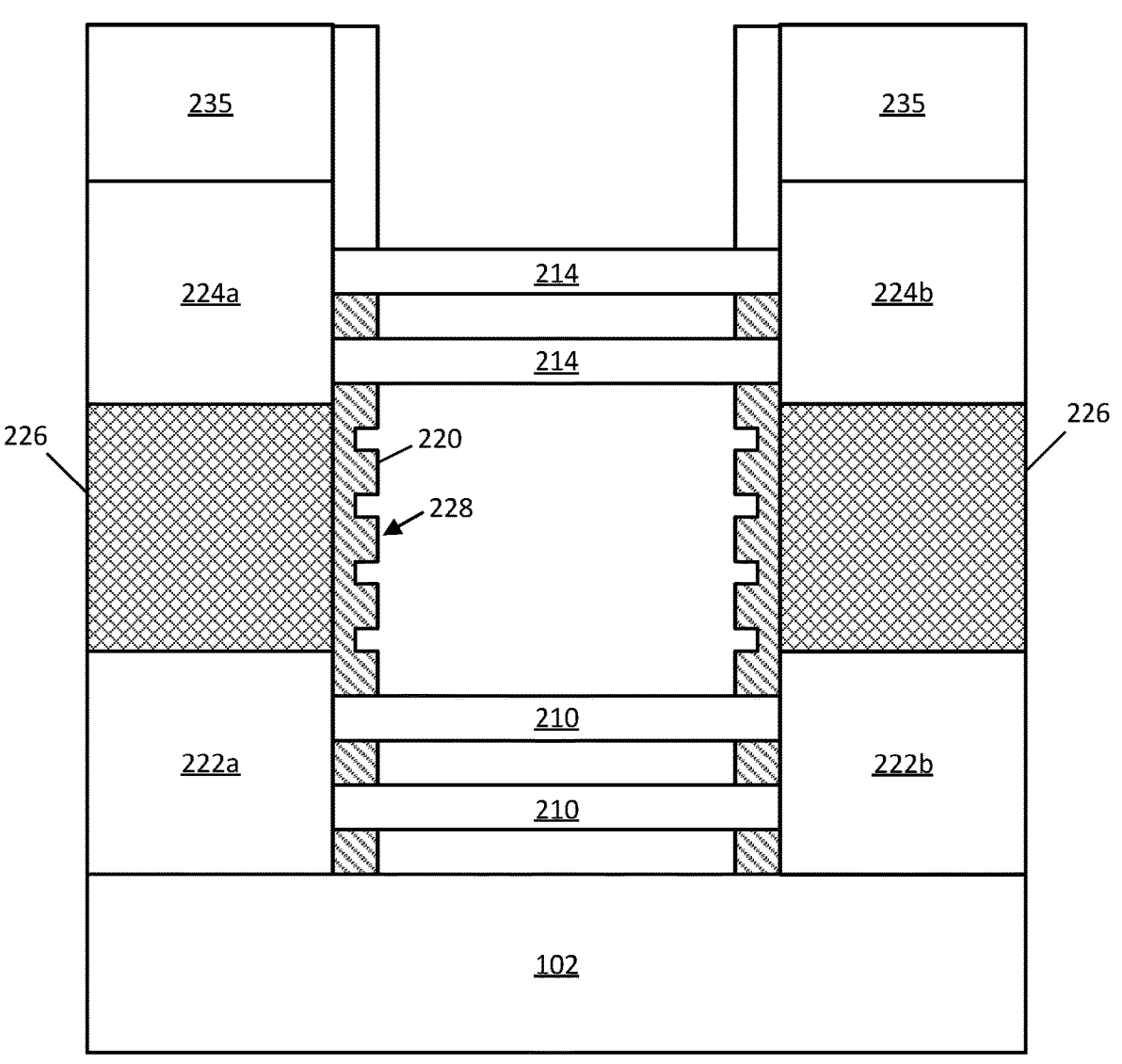

FIG. 2H illustrates a cross-sectional view of the structure shown in FIG. 2G following the removal of the sacrificial gate structure 216 and sacrificial layers 208, according to an embodiment of the present disclosure. Sacrificial gate structure 216 may be removed using any wet or dry isotropic process thus exposing the alternating layer stack of the fin within the trench left behind after the removal of sacrificial gate structure 216. Once sacrificial gate structure 216 has been removed, sacrificial layers 208 may also be removed using a selective isotropic etching process that removes the material of sacrificial layers 208 but does not remove (or removes very little of) first semiconductor layers 210 and second semiconductor layers 214. At this point, the suspended (sometimes called released) first semiconductor layers 210 form nanoribbons or nanowires that extend between first source and drain regions 222a/222b and the suspended second semiconductor layers 214 form nanoribbons or nanowires that extend between second source and drain regions 224a/224b.

According to some embodiments, the thin dummy layers 212 are also removed during the isotropic etching process used to remove sacrificial layers 208. The removal of all or most of dummy layers 212 yields a ribbed (e.g., crenelated or corrugated, with rounded or tapered features, as variously depicted herein) profile along the inner sidewall of internal spacers 220. Each of the ribs 228 may have a height that is substantially the same as the thickness of sacrificial layers 208 (e.g., between about 5 nm and about 10 nm). Due to the substantially equidistant spacing between dummy layers 212, ribs 228 will have a corresponding periodic profile. As discussed above, any of the recesses between adjacent ribs 228 may include some portion or remnant of a dummy layer 212 that did not get completely removed during the etching process. In some other examples, the dummy layers 212 are oxidized and may remain suspended across both internal spacers 220.

Figure 2I:
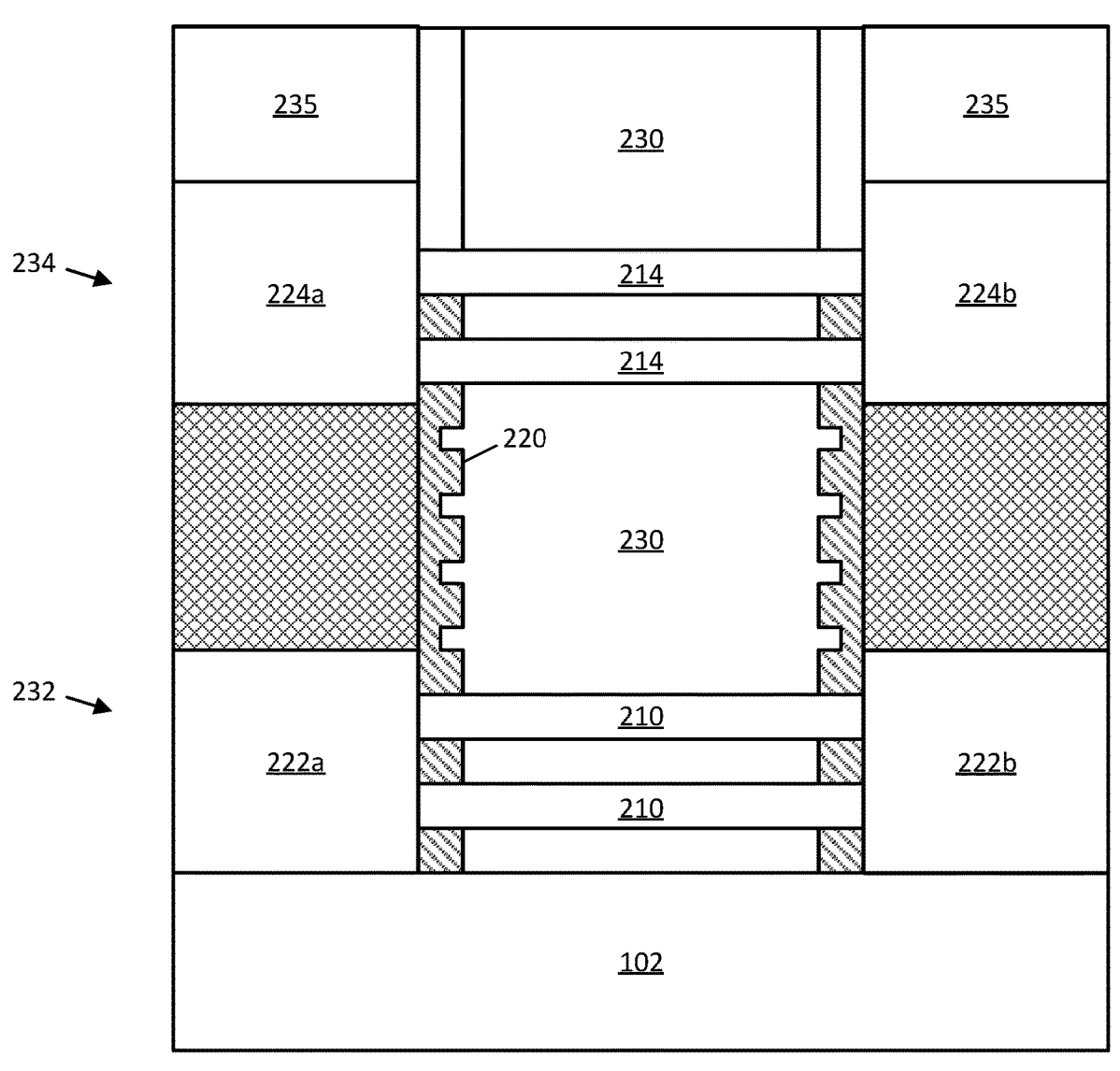
Figure 2I:
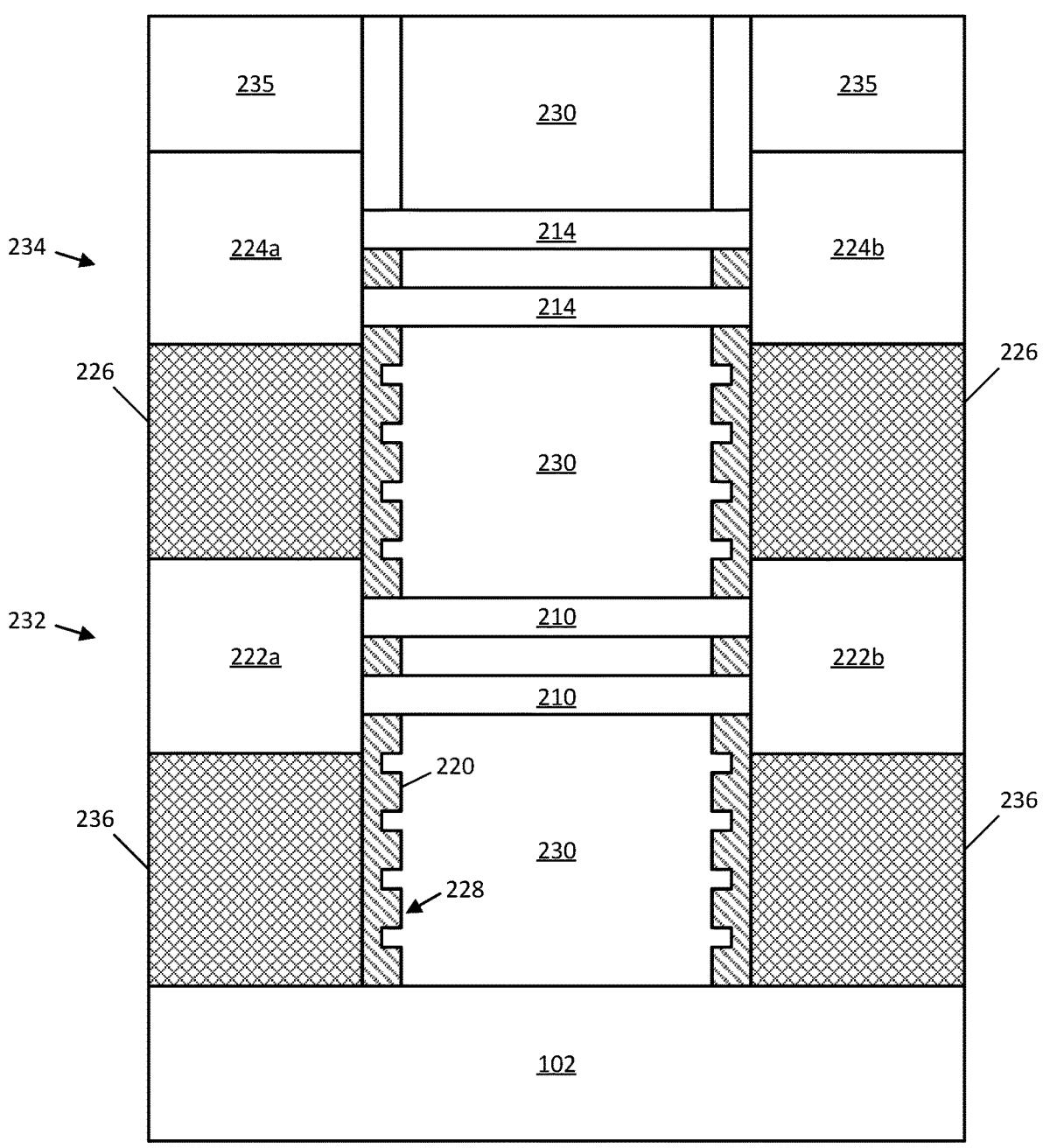
Figure 2I:
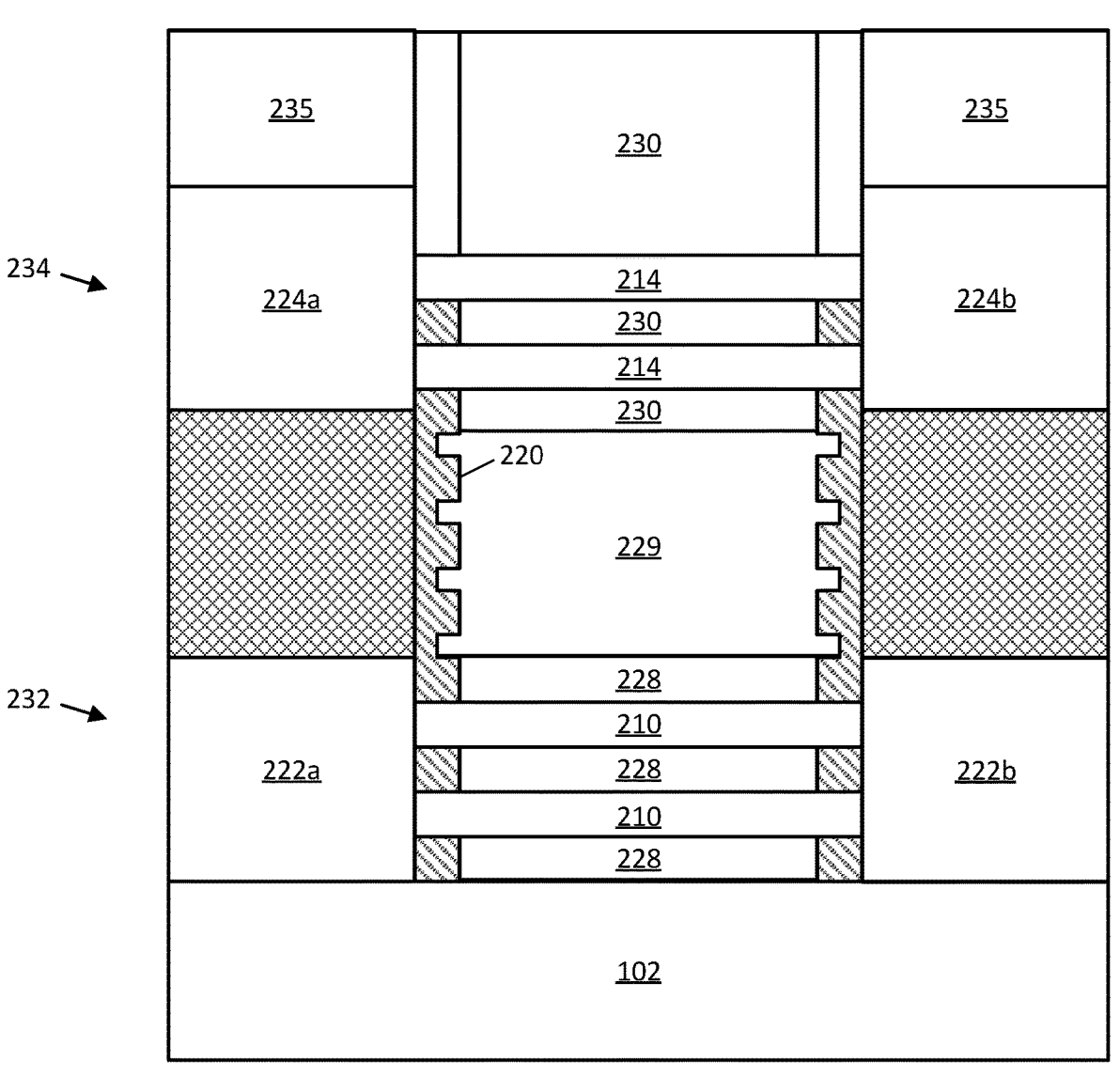

FIG. 2I illustrates a cross-sectional view of the structure shown in FIG. 2H following the formation of a gate structure 230 around the suspended first semiconductor layers 210 and second semiconductor layers 214, according to an embodiment of the present disclosure. As noted above, gate structure 230 includes a gate dielectric and a gate electrode.

The gate dielectric may be conformally deposited around first semiconductor layers 210 and second semiconductor layers 214 using any suitable deposition process, such as ALD. The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on first and second semiconductor layers 210/214, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Recall the workfunction for the lower channel region can be different from the upper channel region, according to some example embodiments.

In the illustrated embodiment of FIG. 2I, the ribbed portion of internal spacer 220 extends between first semiconductor layers 210 of a first semiconductor device 232 and second semiconductor layers 214 of a second semiconductor device 234. However, in some embodiments, ribbed portions of internal spacer 220 may also be found along other regions of internal spacer 220, such as a portion of internal spacer 220 between the first semiconductor layers 210 of first semiconductor device 232 and the substrate 102. FIG. 2I' illustrates another example of an integrated circuit portion having both first semiconductor device 232 and second semiconductor device 234. In this example, internal spacer 220 extends further below first semiconductor device 232 such that additional ribs 228 are observed along internal spacer 220 between first semiconductor device 232 and substrate 102. The additional spacing beneath first semiconductor device 232 may be provided to further isolate first semiconductor device 232 from substrate 102 and may have a height between about 15 nm and about 40 nm. According to some embodiments, another insulator layer 236 may be provided below first source region 222a and first drain region 222b. Insulator layer 236 may have the substantially same composition as insulator layer 226. In some other embodiments, first source region 222a and first drain region 222b are formed along the entire portion of internal spacers 220 between substrate 102 and first semiconductor device 232.

FIG. 2I" illustrates a cross-sectional view of the structure shown in FIG. 2H following the formation of a lower gate structure 228 around the released first semiconductor layers 210 and an upper gate structure 230 around the released second semiconductor layers 214, along with isolation structure 229, according to another embodiment of the present disclosure. The previous relevant discussion for each of the depicted features is equally applicable here. Note that the lower gate structure 228 may be configured differently from the upper gate structure 230, or the same. In one example case, the lower gate structure 228 and the upper gate structure 230 include the same gate dielectric and gate electrode fill metal (if any), but include different workfunction materials in their respective gate electrodes. For instance, one of the upper or lower gate electrode may include a p-type workfunction material (e.g., titanium nitride) and the other of the upper or lower gate electrode may include an n-type workfunction material (e.g., titanium aluminum carbide). The isolation structure 229 can be any suitable dielectric material, such as silicon oxide, and may be the same material, for instance, as insulating layers 226 and/or 235. In some cases, the lower gate structure 228 materials are deposited on both the lower and upper channel regions, followed by an etch-back process to remove those materials from the upper channel region. Then, isolation structure 229 can be deposited within the gate trench on top of the lower gate structure 228, and recessed to a desired level. Then the upper gate structure 230 materials can be deposited. Note in the example embodiment shown that the isolation structure 229 extends across all of the recesses between ribs 228 of spacer structures 220 in this example, but in other examples, may only extend across some of those recesses. The previous relevant discussion with respect to the recesses including one or more gate structures materials, as well as symmetry (or asymmetry, as the case may be) of the gate structures 230 and 228, is equally applicable here.

Figure 3:
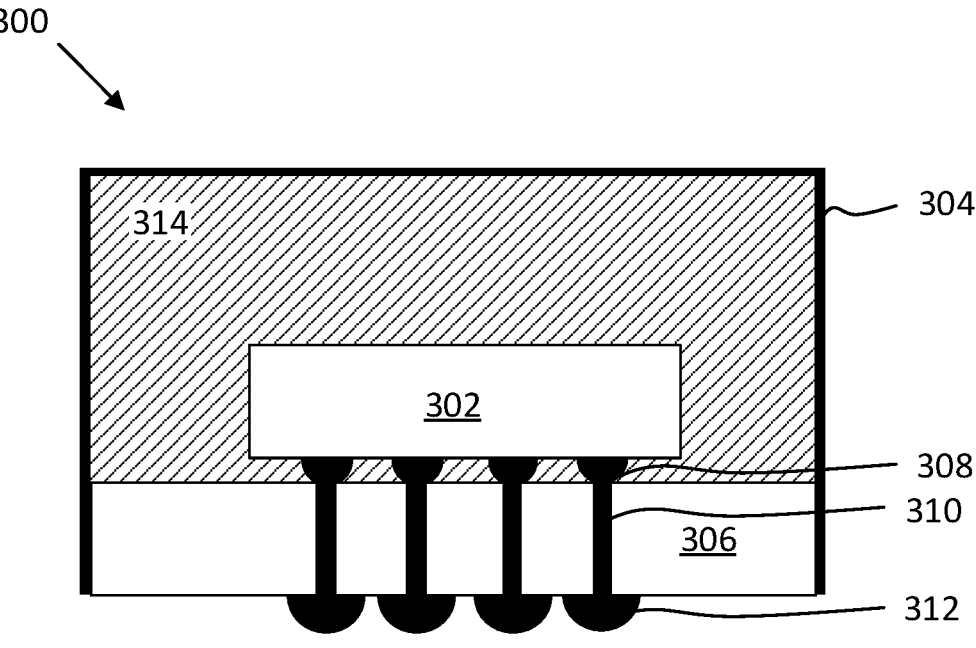
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 303 to contact one or more intermediate locations therein). In still other embodiments, vias 310 are fabricated by multiple smaller stacked vias, or are staggered at different locations across package substrate 303. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 303 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
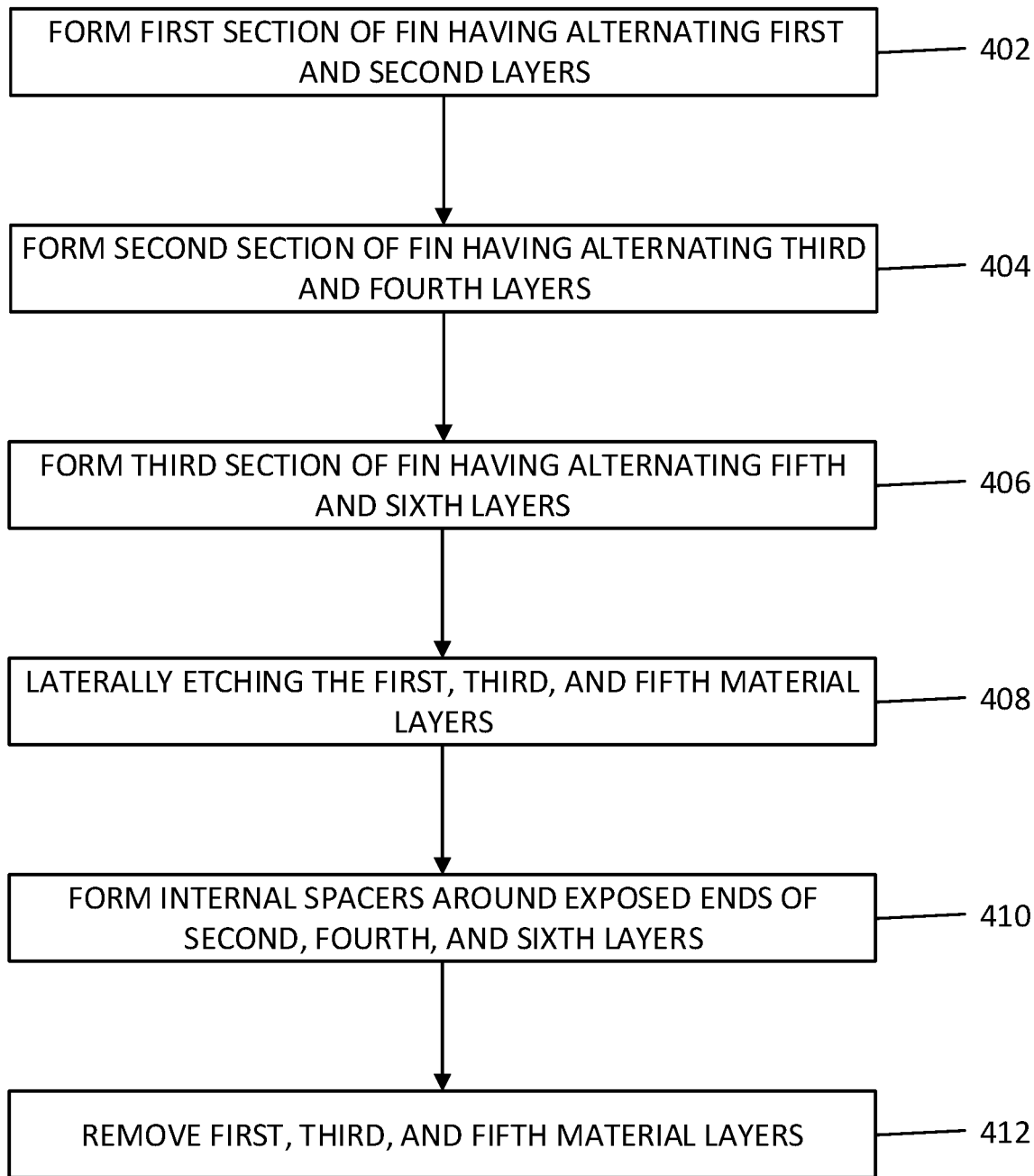
FIG. 4 is a flowchart of a fabrication process for a semiconductor device with a particular spacer structure geometry, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2I". However, the correlation of the various operations of method 400 to the specific components illustrated in the aforementioned figures is not intended to imply any structural and/or use limitations. Rather, the aforementioned figures provide some example embodiments of method 400. Other operations may be performed before, during, or after any of the operations of method 400. Some of the operations of method 400 may be performed in a different order than the illustrated order.

Method 400 begins with operation 402 where a first section of a fin is formed having alternating first and second layers. The first layers may be sacrificial layers (e.g., comprising SiGe) while the second layers include a semiconductor material (e.g., Si, SiGe, Ge, InP, or GaAs) suitable for use as a nanoribbon channel. The first section may be formed over a substrate. The thickness of each of the first and second layers may be between about 5 nm and about 20 nm or between about 5 nm and about 10 nm. Each of the first and second layers may be deposited using any known material deposition technique, such as CVD, PECVD, PVD, or ALD.

Method 400 continues with operation 404 where a second section of the fin is formed having alternating third and fourth layers. The third layers may be substantially the same as the first layers (sacrificial layers) with substantially the same thickness of the first layers. The fourth layers may be dummy layers that have the same material composition as the second layers, or any material composition that exhibits sufficient etch selectively with the first and third layers. The thickness of the fourth layers may be between about 1 nm and about 4 nm. Each of the third and fourth layers may be deposited using any known material deposition technique, such as CVD, PECVD, PVD, or ALD.

Method 400 continues with operation 406 where a third section of the fin is formed having alternating fifth and sixth layers. The fifth layers may be substantially the same as the first and third layers (sacrificial layers) with substantially the same thickness of the first and third layers. The sixth layers include a semiconductor material (e.g., Si, SiGe, Ge, InP, or GaAs) suitable for use as a nanoribbon channel and may include substantially the same material composition as the second layers. The thickness of each of the fifth and sixth layers may be between about 5 nm and about 20 nm or between about 5 nm and about 10 nm. Each of the fifth and sixth layers may be deposited using any known material deposition technique, such as CVD, PECVD, PVD, or ALD.

According to some embodiments, once the material layers have been deposited, one or more fins may be defined via an anisotropic etching process, such as RIE, using a patterned mask material to protect the fins from the etch. The fin height may include the alternating material layers of each of the three sections and a sub fin portion formed from the substrate material. In some other embodiments, trenches are first formed in a dielectric material and the alternating material layers of the three aforementioned sections are formed within the trenches to form one or more multilayer fins.

Method 400 continues with operation 408 where the first, third, and fifth layers (e.g., the sacrificial layers) are laterally etched. An isotropic etching process may be used to recess the exposed ends of each of the first, third, and fifth layers along the entire layer stack of the fin. Due to the presence of the fourth layers (e.g., dummy layers) each of first, third, and fifth layers has substantially the same thickness which yields a more uniform etching profile across each layer. According to some embodiments, the etching process also causes the ends of fourth layers to recess inwards more than either second or sixth layers.

Method 400 continues with operation 410 where inner spacer structures are formed around the exposed ends of the second, fourth, and sixth layers following the recessing of the first, third, and fifth layers. The internal spacers 220 may be any suitable dielectric material that exhibits high etch selectively to semiconductor materials such as silicon and/or silicon germanium. The Internal spacers may be conformally deposited using a CVD process like ALD. According to some embodiments, the internal spacers conformally form around the ends of the fourth layers that are periodically provided between the group of second layers and the group of sixth layers, thus providing a more uniform sidewall topography once the internal spacers have been recessed back to expose the ends of the second and sixth layers.

Method 400 continues with operation 412 where the first, third, and fifth layers (e.g., sacrificial layers) are removed leaving behind suspended second and sixth layers. The first, third, and fifth layers may be removed using a selective isotropic etching process that removes the material of the first, third, and fifth layers but does not remove (or removes very little of) second layers and sixth layers. At this point, the suspended second layers form nanoribbons or nanowires that extend between corresponding first source and drain regions and the suspended sixth layers form nanoribbons or nanowires that extend between corresponding second source and drain regions.

According to some embodiments, the thinner fourth layers are also removed during the isotropic etching process used to remove the first, third, and fifth layers. The removal of all or most of the fourth layers yields a ribbed profile along the inner sidewall of the internal spacers. Each of the ribs may have a height that is substantially the same as the thickness of the third layers (e.g., between about 5 nm and about 10 nm). Due to the substantially equidistant spacing between the fourth layers, the ribs will have a corresponding periodic profile. As discussed above, any of the recesses between adjacent ribs may include some portion of the fourth layer that did not get completely removed during the etching process. In some other examples, the fourth layers are oxidized and may remain suspended across both of the internal spacers.

Example System

Figure 5:
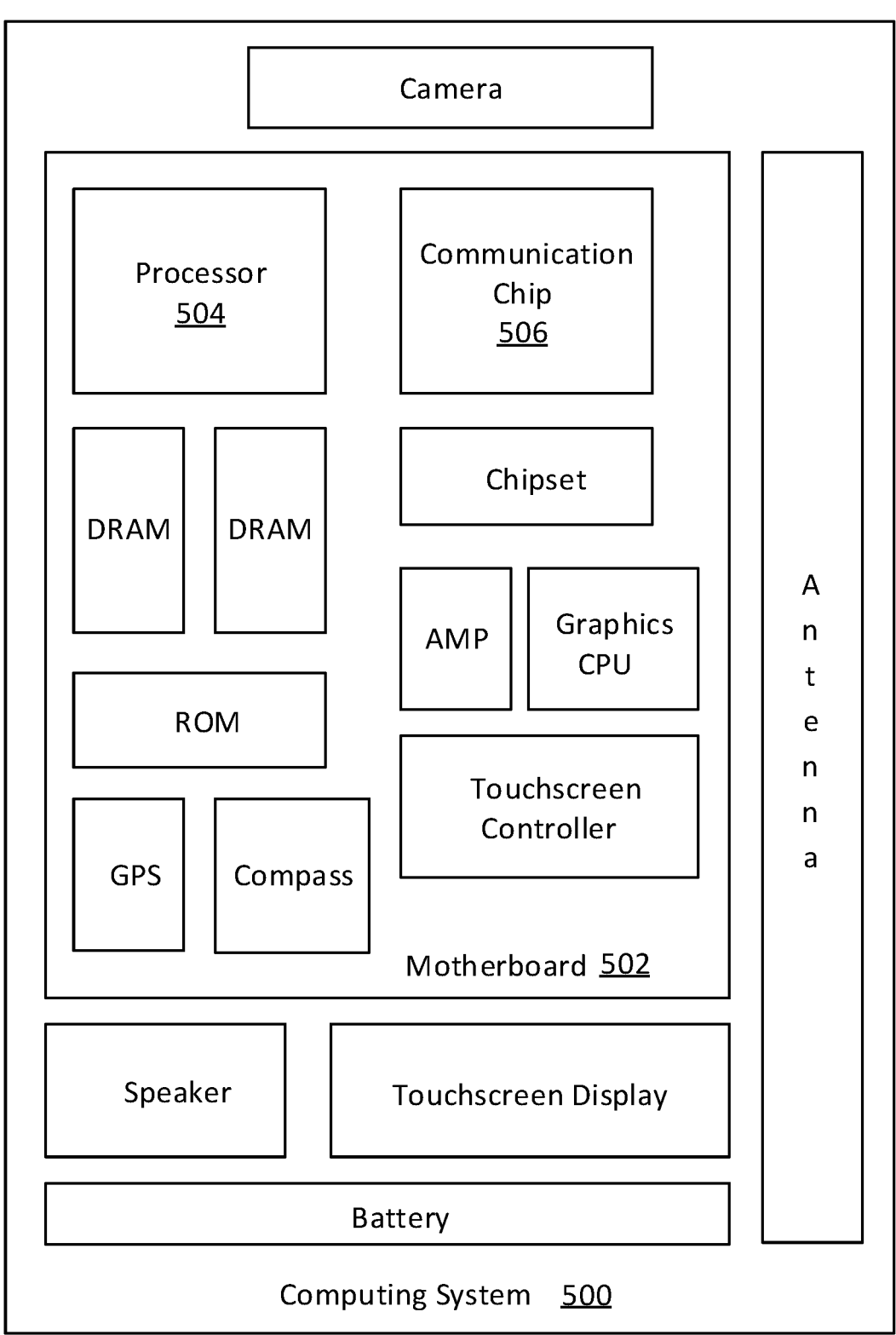
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit device on a substrate, the substrate having a stacked configuration of semiconductor devices, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor body extending in a first direction between a first source region and a first drain region, and a second semiconductor body extending in the first direction between a second source region and a second drain region. The first semiconductor body is spaced vertically from the second semiconductor body in a second direction orthogonal to the first direction. The integrated circuit also includes a spacer structure that extends between the first semiconductor body and the second semiconductor body in the second direction and a gate structure around one or both the first semiconductor body and the second semiconductor body. The spacer structure includes one or more rib features between the first semiconductor body and the second semiconductor body.

Example 2 includes the subject matter of Example 1, wherein the first semiconductor body and the second semiconductor body comprise germanium, silicon, or any combination thereof.

Example 3 includes the subject matter of Example 2, wherein the first semiconductor body is n-type silicon and the second semiconductor body is p-type silicon.

Example 4 includes the subject matter of any one of Examples 1-3, wherein the first semiconductor body is a first nanoribbon and the second semiconductor body is a second nanoribbon.

Example 5 includes the subject matter of any one of Examples 1-4, wherein a vertical distance between the first semiconductor body and the second semiconductor body is between 20 nm and 60 nm.

Example 6 includes the subject matter of any one of Examples 1-5, wherein the spacer structure includes a plurality of periodically-spaced rib features between the first semiconductor body and the second semiconductor body.

Example 7 includes the subject matter of Example 6, wherein the spacer structure includes recesses between adjacent rib features of the plurality of periodically-spaced rib features, and wherein one or more of the recesses includes semiconductor material or oxidized semiconductor material.

Example 8 includes the subject matter of any one of Examples 1-7, wherein a height of each of the one or more rib features is between about 5 nm and about 10 nm.

Example 9 includes the subject matter of any one of Examples 1-8, wherein the second semiconductor body is over the first semiconductor body, and the spacer structure extends below the first semiconductor body such that the spacer structure includes additional one or more rib features below the first semiconductor body.

Example 10 includes the subject matter of any one of Examples 1-9, wherein the gate structure is a first gate structure around the first semiconductor body, and the integrated circuit further includes a second gate structure around the second semiconductor body, and an isolation structure between the first gate structure and the second gate structure.

Example 11 includes the subject matter of any one of Examples 1-10, wherein the first semiconductor body, the second semiconductor body, the spacer structure, and the gate structure are part of a forksheet transistor device.

Example 12 includes the subject matter of any one of Examples 1-11, wherein the first semiconductor body, the second semiconductor body, the spacer structure, and the gate structure are part of a stacked transistor structure.

Example 13 is a printed circuit board comprising the integrated circuit of any one of Examples 1-12.

Example 14 is a microprocessor comprising the integrated circuit of any one of Examples 1-12.

Example 15 is a memory chip comprising the integrated circuit of any one of Examples 1-12.

Example 16 is an electronic device that includes a chip package having one or more dies. At least one of the one or more dies includes a semiconductor device having a first plurality of semiconductor nanoribbons extending in a first direction between a first source region and a first drain region and a second plurality of semiconductor nanoribbons extending in the first direction between a second source region and a second drain region. The first plurality of semiconductor nanoribbons are spaced vertically from the second plurality of semiconductor nanoribbons in a second direction orthogonal to the first direction. The at least one of the one or more dies further includes a spacer structure that extends between the first plurality of semiconductor nanoribbons and the second plurality of semiconductor nanoribbons in the second direction and a gate structure around both the first plurality of semiconductor nanoribbons and the second plurality of semiconductor nanoribbons. The spacer structure includes one or more rib features between the first plurality of semiconductor nanoribbons and the second plurality of semiconductor nanoribbons.

Example 17 includes the subject matter of Example 16, wherein the first plurality of semiconductor nanoribbons and the second plurality of semiconductor nanoribbons comprise germanium, silicon, or any combination thereof.

Example 18 includes the subject matter of Example 17, wherein the first plurality of semiconductor nanoribbons is n-type silicon and the second plurality of semiconductor nanoribbons is p-type silicon.

Example 19 includes the subject matter of any one of Examples 16-18, wherein a vertical distance between the first plurality of semiconductor nanoribbons and the second plurality of semiconductor nanoribbons is between about 20 nm and about 60 nm.

Example 20 includes the subject matter of any one of Examples 16-19, wherein the spacer structure includes a plurality of periodically-spaced rib features between the first plurality of semiconductor nanoribbons and the second plurality of semiconductor nanoribbons.

Example 21 includes the subject matter of Example 20, wherein the spacer structure includes recesses between adjacent rib features of the plurality of periodically-spaced rib features, and wherein one or more of the recesses includes a plug of semiconductor material or oxidized semiconductor material.

Example 22 includes the subject matter of any one of Examples 16-21, wherein a height of each of the one or more rib features is between about 5 nm and about 10 nm.

Example 23 includes the subject matter of any one of Examples 16-22, wherein the first plurality of semiconductor nanoribbons are over the second plurality of semiconductor nanoribbons, and the spacer structure extends below the second plurality of semiconductor nanoribbons such that the spacer structure includes additional one or more rib features below the second plurality of semiconductor nanoribbons.

Example 24 includes the subject matter of any one of Examples 16-23, further comprising a printed circuit board, wherein the chip package is attached to the printed circuit board.

Example 25 is a method of forming an integrated circuit. The method includes forming a first section of a multilayer fin, the first section including first material layers alternating with second material layers, the second material layers comprising a semiconductor material suitable for use as a nanoribbon channel; forming a second section of the multilayer fin over the first section, the second section having third material layers alternating with fourth material layers, wherein the third material layers are compositionally the same as the first material layers, and wherein the fourth material layers are thinner than the second material layers; forming a third section of the multilayer fin over the second section, the third section including fifth material layers alternating with sixth material layers, wherein the fifth material layers are compositionally the same as the first and third material layers, and the sixth material layers comprise a semiconductor material suitable for use as a nanoribbon channel; laterally etching portions of the first, third, and fifth material layers; and forming internal spacers around exposed ends of the second, fourth, and sixth material layers.

Example 26 includes the subject matter of Example 25, wherein the first, third, and fifth material layers comprise silicon and germanium and the second, fourth, and sixth material layers comprise silicon.

Example 27 includes the subject matter of Example 25 or 26, wherein the fourth material layers have a thickness between about 1 nm and about 4 nm and the second and sixth material layers have a thickness between about 5 nm and about 10 nm.

Example 28 includes the subject matter of any one of Examples 25-27, wherein the first, third, and fifth material layers have a substantially same thickness between about 5 and about 10 nm.

Example 29 includes the subject matter of any one of Examples 25-28, further comprising removing the first, third, and fifth material layers.

Example 30 includes the subject matter of Example 29, wherein removing the first, third, and fifth material layers also removes the fourth material layers.

Example 31 includes the subject matter of Example 29 or 30, further comprising forming a gate structure around portions of the second material layers and around portions of the sixth material layers.

Example 32 includes the subject matter of any one of Examples 25-31, further comprising oxidizing at least a portion of each of the fourth material layers.

Example 33 includes the subject matter of any one of Examples 25-32, further comprising doping the second material layers with p-type dopants and doping the sixth material layers with n-type dopants.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a first semiconductor body extending in a first direction between a first source region and a first drain region and a second semiconductor body extending in the first direction between a second source region and a second drain region, the first semiconductor body spaced vertically from the second semiconductor body in a second direction orthogonal to the first direction;
   a dielectric spacer structure that extends between the first semiconductor body and the second semiconductor body in the second direction, wherein the dielectric spacer structure includes a plurality of rib features between the first semiconductor body and the second semiconductor body, wherein the plurality of rib features includes at least one rib feature having a first recess above the at least one rib feature along the second direction and a second recess below the at least one rib feature along the second direction; and
   a gate structure around one or both the first semiconductor body and the second semiconductor body.

2. The integrated circuit of claim 1, wherein the first semiconductor body is n-type silicon and the second semiconductor body is p-type silicon.

3. The integrated circuit of claim 1, wherein the first semiconductor body is a first nanoribbon and the second semiconductor body is a second nanoribbon.

4. The integrated circuit of claim 1, wherein a vertical distance between the first semiconductor body and the second semiconductor body is between 20 nm and 60 nm.

5. The integrated circuit of claim 1, wherein the plurality of rib features is a plurality of periodically-spaced rib features between the first semiconductor body and the second semiconductor body.

6. The integrated circuit of claim 1, wherein one or both of the first recess and the second recess is at least partially filled with semiconductor material or oxidized semiconductor material.

7. The integrated circuit of claim 1, wherein a height of each of the plurality of rib features is between about 5 nm and about 10 nm.

8. The integrated circuit of claim 1, wherein the gate structure is a first gate structure around the first semiconductor body, and the integrated circuit further includes:
   a second gate structure around the second semiconductor body; and
   an isolation structure between the first gate structure and the second gate structure.

9. A printed circuit board comprising the integrated circuit of claim 1.

10. An electronic device, comprising:
   a chip package comprising one or more dies, at least one of the one or more dies comprising
      a semiconductor device having a first plurality of semiconductor nanoribbons extending in a first direction between a first source region and a first drain region and a second plurality of semiconductor nanoribbons extending in the first direction between a second source region and a second drain region, the first plurality of semiconductor nanoribbons spaced vertically from the second plurality of semiconductor nanoribbons in a second direction orthogonal to the first direction;

a dielectric spacer structure that extends between the first plurality of semiconductor nanoribbons and the second plurality of semiconductor nanoribbons in the second direction, wherein the dielectric spacer structure includes a plurality of rib features between the first plurality of semiconductor nanoribbons and the second plurality of semiconductor nanoribbons, wherein the plurality of rib features includes at least one rib feature having a first recess above the at least one rib feature along the second direction and a second recess below the at least one rib feature along the second direction; and a gate structure around both the first plurality of semiconductor nanoribbons and the second plurality of semiconductor nanoribbons.

11. The electronic device of claim 10, wherein the first plurality of semiconductor nanoribbons is n-type silicon and the second plurality of semiconductor nanoribbons is p-type silicon.

12. The electronic device of claim 10, wherein a vertical distance between the first plurality of semiconductor nanoribbons and the second plurality of semiconductor nanoribbons is between about 20 nm and about 60 nm.

13. The electronic device of claim 10, wherein the plurality of rib features is a plurality of periodically-spaced rib features between the first plurality of semiconductor nanoribbons and the second plurality of semiconductor nanoribbons.

14. The electronic device of claim 13, wherein one or both of the first recess and the second recess includes a plug of semiconductor material or oxidized semiconductor material.

15. The electronic device of claim 10, wherein a height of each of the plurality of rib features is between about 5 nm and about 10 nm.

16. The electronic device of claim 10, wherein the first plurality of semiconductor nanoribbons are over the second plurality of semiconductor nanoribbons, and the dielectric spacer structure extends below the second plurality of semiconductor nanoribbons such that the dielectric spacer structure includes additional one or more rib features below the second plurality of semiconductor nanoribbons.

17. The electronic device of claim 10, further comprising a printed circuit board, wherein the chip package is attached to the printed circuit board.

18. An integrated circuit comprising:

a first plurality of semiconductor nanoribbons extending in a first direction between a first source region and a first drain region and a second plurality of semiconductor nanoribbons extending in the first direction between a second source region and a second drain region, the first plurality of semiconductor nanoribbons spaced vertically over the second plurality of semiconductor nanoribbons in a second direction orthogonal to the first direction;

a dielectric spacer structure that extends between a bottommost nanoribbon of the first plurality of semiconductor nanoribbons and a topmost nanoribbon of the second plurality of semiconductor nanoribbons in the second direction, wherein the dielectric spacer structure includes a plurality of rib features between the topmost nanoribbon and the bottommost nanoribbon and a plurality of recesses alternating with the plurality of rib features; and a gate structure around one or both the first plurality of semiconductor nanoribbons and the second plurality of semiconductor nanoribbons.

19. The integrated circuit of claim 18, wherein the plurality of rib features is a plurality of periodically-spaced rib features between the topmost nanoribbon and the bottommost nanoribbon.

20. The integrated circuit of claim 18, wherein a vertical distance between the bottommost nanoribbon of the first plurality of semiconductor nanoribbons and the topmost nanoribbon of the second plurality of semiconductor nanoribbons is between about 20 nm and about 60 nm.

* * * * *